United States Patent
Miki et al.

(10) Patent No.: US 7,724,056 B2
(45) Date of Patent: May 25, 2010

(54) SEMICONDUCTOR INTEGRATED CIRCUIT DEVICE OPERATING IN SYNCHRONISM WITH CLOCK AND METHOD FOR CONTROLLING DUTY OF CLOCK

(75) Inventors: Kazuhiko Miki, Yokohama (JP); Yutaka Nakamura, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 134 days.

(21) Appl. No.: 12/027,101

(22) Filed: Feb. 6, 2008

(65) Prior Publication Data

US 2008/0191768 A1  Aug. 14, 2008

(30) Foreign Application Priority Data

Feb. 8, 2007 (JP) ............................. 2007-029328
May 23, 2007 (JP) ............................. 2007-136886

(51) Int. Cl.
*H03K 3/017* (2006.01)
(52) U.S. Cl. ...................................... 327/175; 327/172
(58) Field of Classification Search ....................... None
See application file for complete search history.

(56) References Cited

U.S. PATENT DOCUMENTS

| | | | | |
|---|---|---|---|---|
| 5,057,702 A | * | 10/1991 | Kitagawa | |
| 5,675,273 A | * | 10/1997 | Masleid | 327/156 |
| 6,642,760 B1 | * | 11/2003 | Alon et al. | 327/158 |
| 6,703,879 B2 | * | 3/2004 | Okuda et al. | 327/158 |
| 7,142,028 B2 | * | 11/2006 | Chun | 327/175 |
| 7,180,346 B2 | * | 2/2007 | Lee | 327/175 |
| 7,203,860 B2 | * | 4/2007 | Ishida et al. | 713/503 |
| 7,225,092 B2 | * | 5/2007 | Boerstler | |
| 7,245,172 B2 | * | 7/2007 | Boerstler | |
| 7,279,946 B2 | * | 10/2007 | Minzoni | 327/158 |
| 7,317,341 B2 | * | 1/2008 | Cho | 327/175 |
| 7,403,055 B2 | * | 7/2008 | Minzoni | 327/175 |
| 7,423,465 B2 | * | 9/2008 | Gomm | 327/175 |

FOREIGN PATENT DOCUMENTS

| | | | |
|---|---|---|---|
| JP | 7-114349 | * | 5/1995 |
| JP | 2-262714 | * | 10/1995 |
| JP | 2004-088434 | * | 3/2004 |
| JP | 2005-159613 | * | 6/2005 |

* cited by examiner

*Primary Examiner*—Cassandra Cox
(74) *Attorney, Agent, or Firm*—Sprinkle IP Law Group

(57) ABSTRACT

A semiconductor integrated circuit device includes a processor, a first clock generating section and a control section. The processor core operates in synchronism with a first clock and includes first and second critical paths. The first clock generating section controls a duty of an externally input second clock to generate the first clock. a control section detects a first phase difference between the first clock and a third clock obtained by delaying the first clock by a delay time in the first critical path and a second phase difference between the first clock and a fourth clock obtained by delaying the first clock by a delay time in the second critical path. The control section instructs the first clock generating section to control the duty so as to minimize a difference between the first and second phase differences.

20 Claims, 20 Drawing Sheets

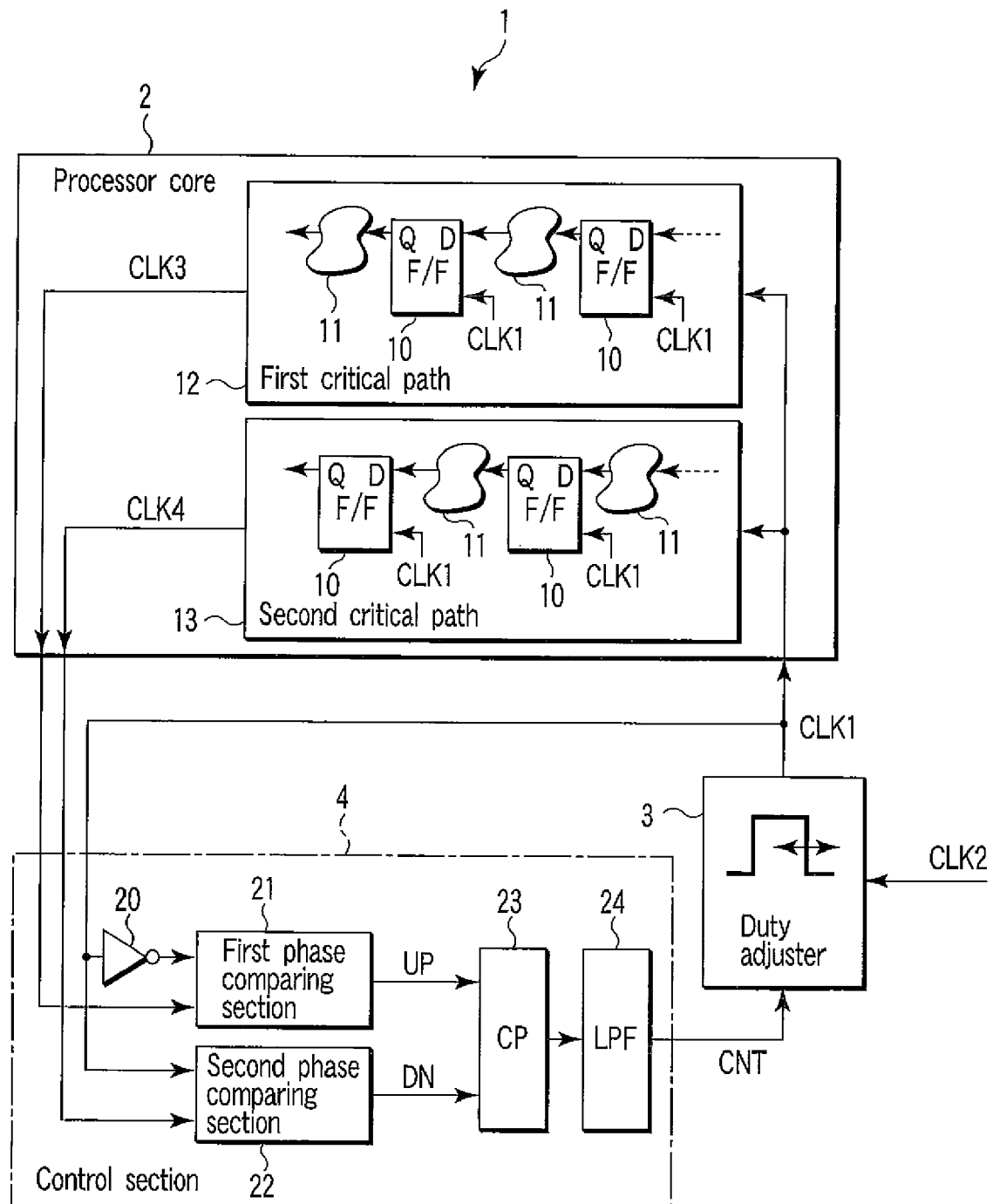
F I G. 1

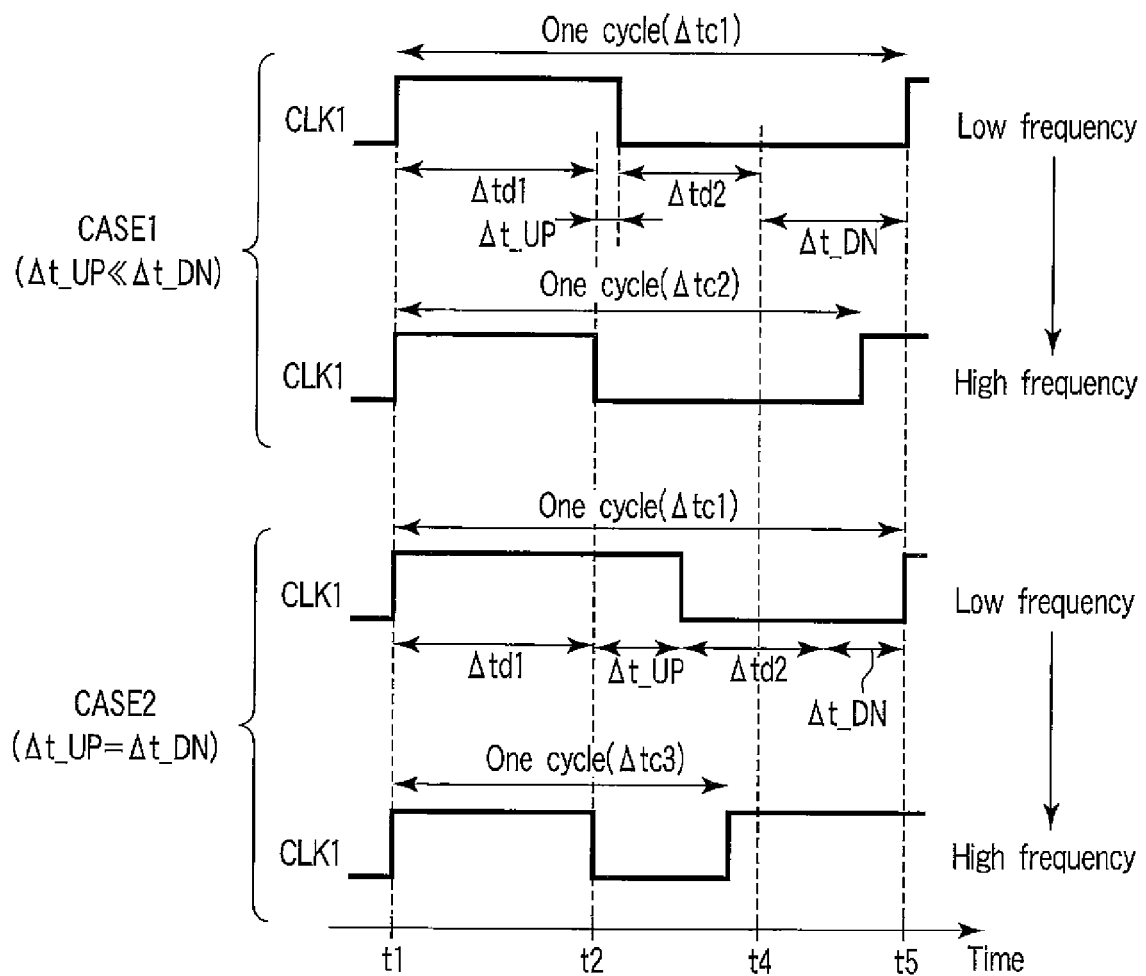
F I G. 5

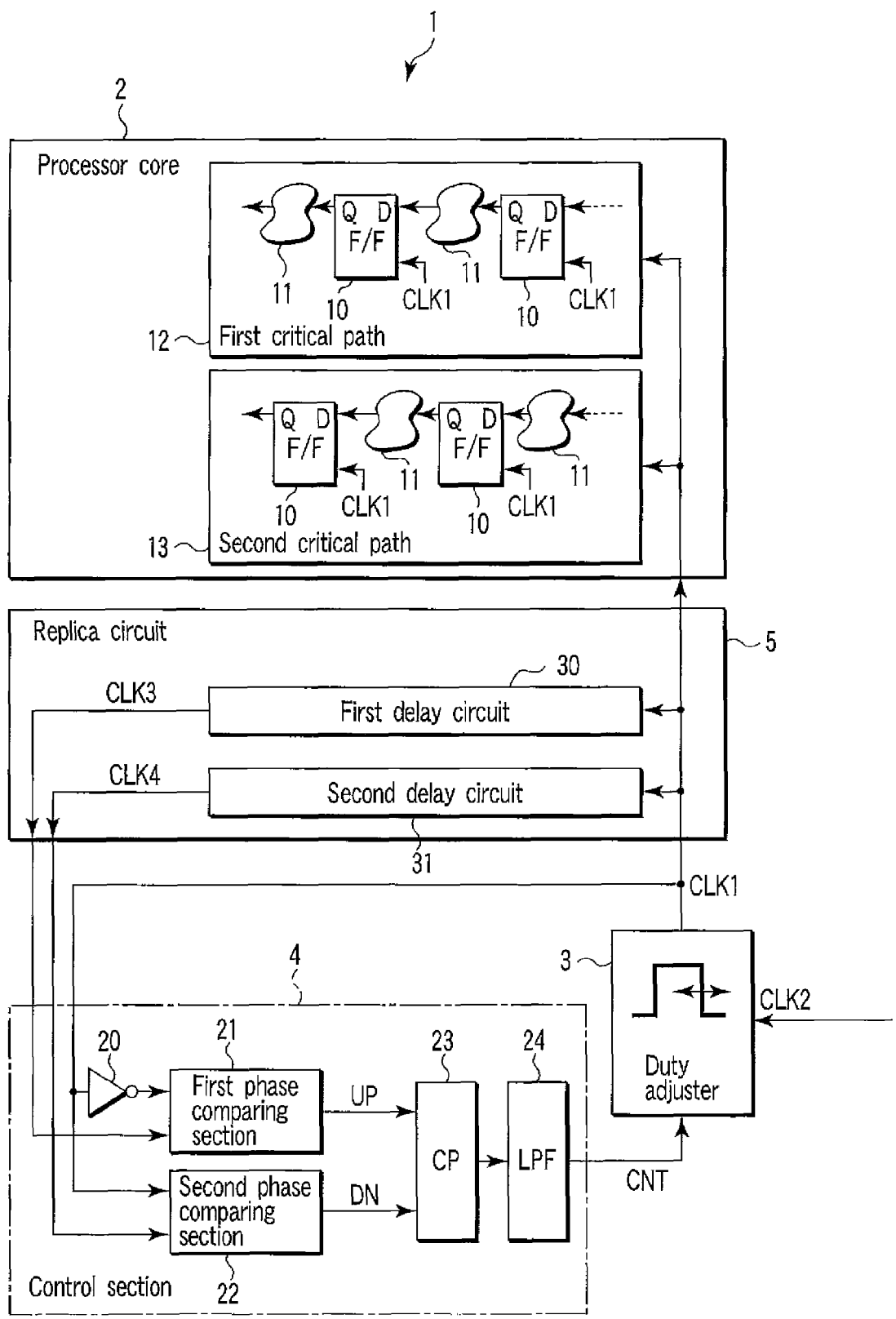
F I G. 6

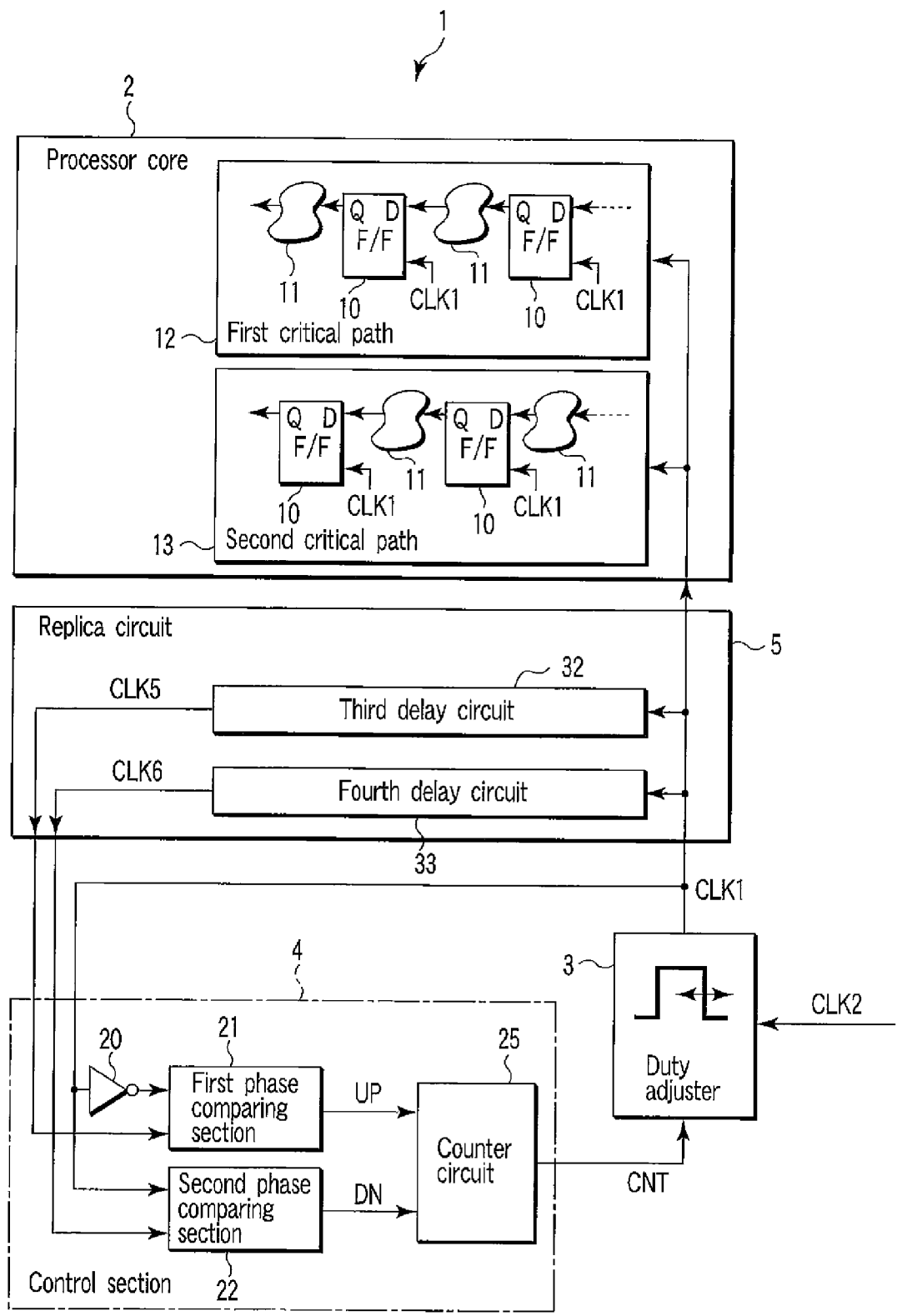
F I G. 8

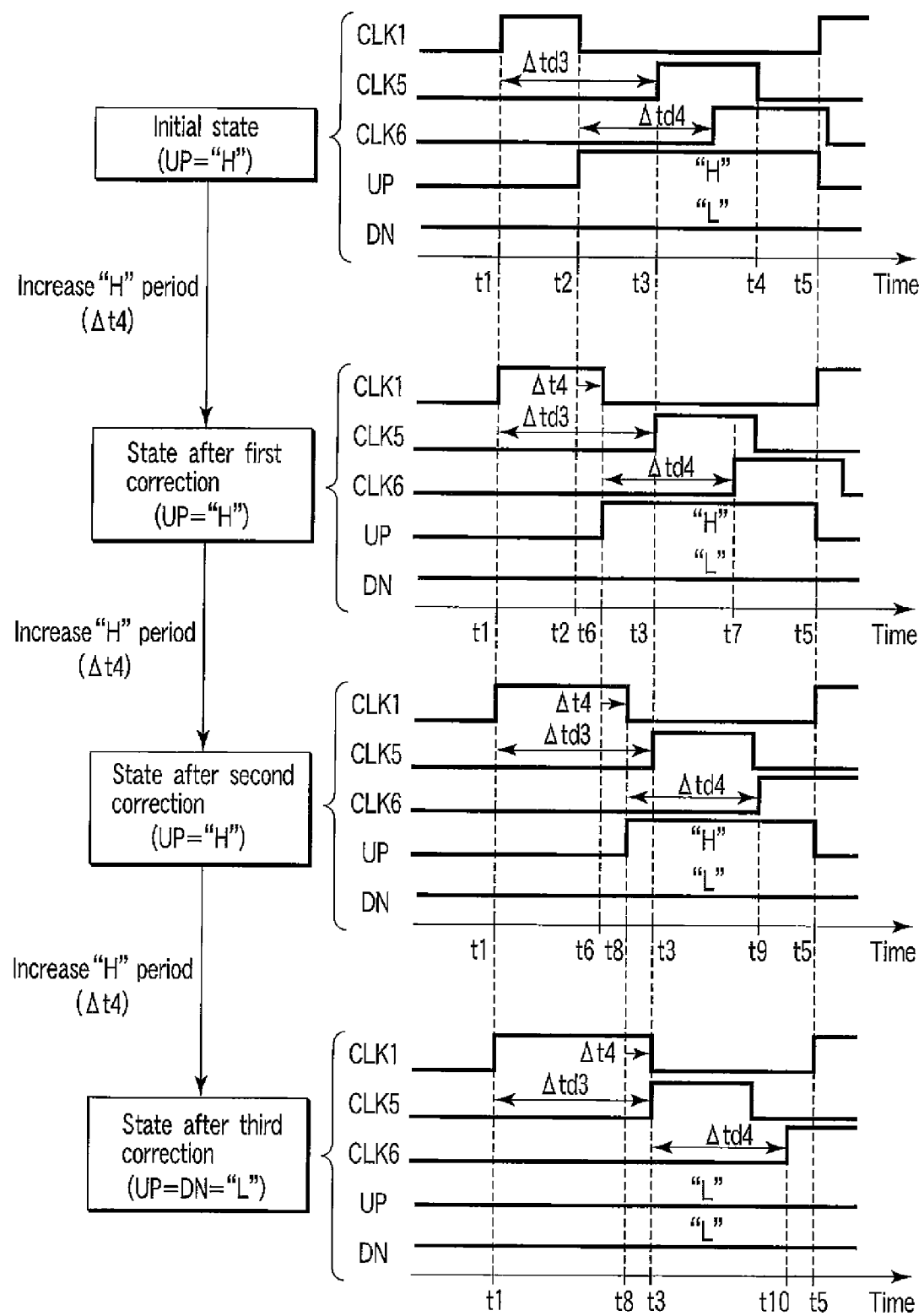
F I G. 12

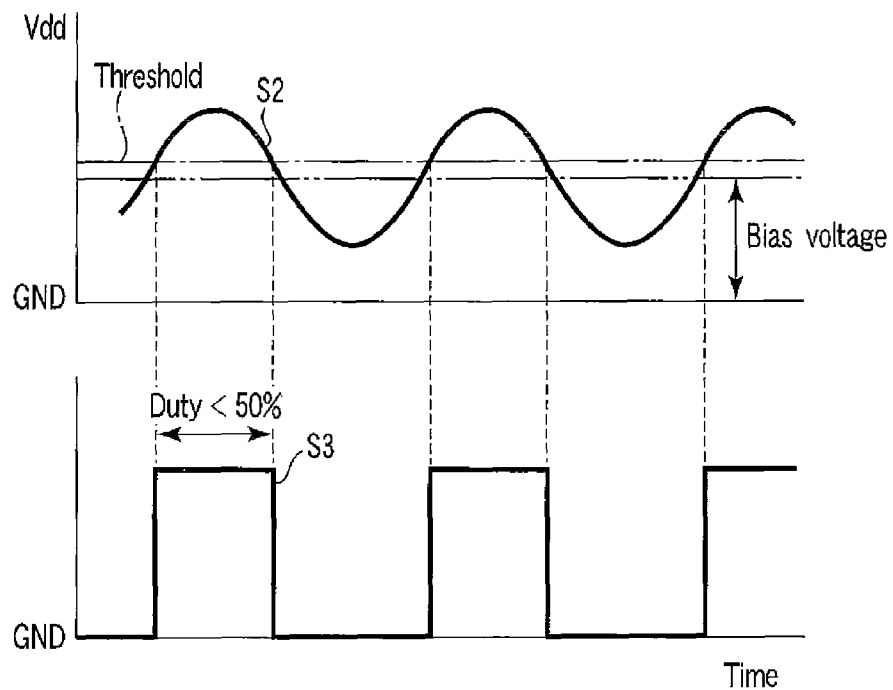
F I G. 20
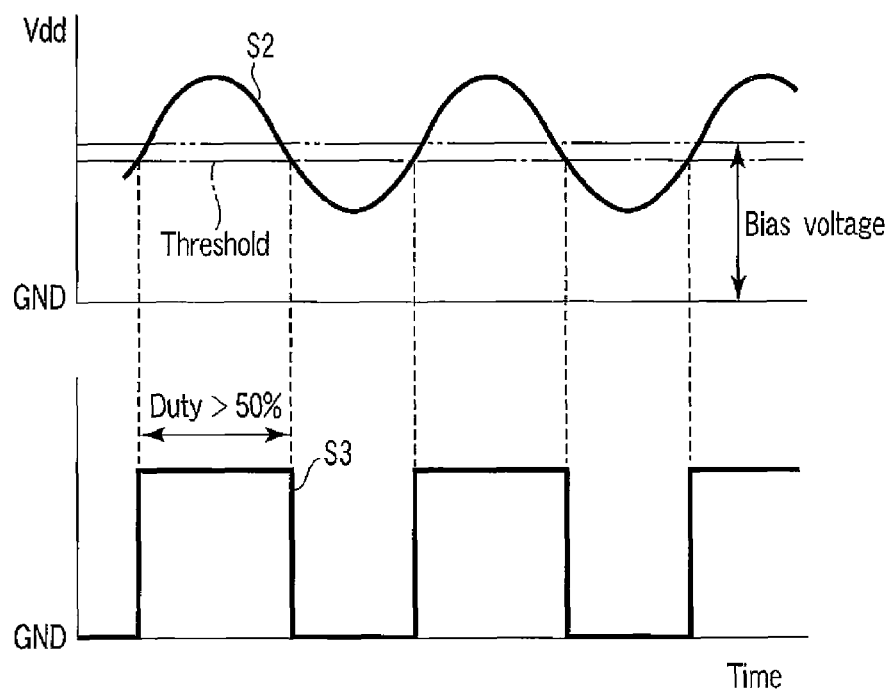
F I G. 21

SEMICONDUCTOR INTEGRATED CIRCUIT DEVICE OPERATING IN SYNCHRONISM WITH CLOCK AND METHOD FOR CONTROLLING DUTY OF CLOCK

CROSS-REFERENCE TO RELATED APPLICATIONS

This application is based upon and claims the benefit of priority from prior Japanese Patent Applications No. 2007-029328, filed Feb. 8, 2007; and No. 2007-136886, filed May 23, 2007, the entire contents of which are incorporated herein by reference.

BACKGROUND OF THE INVENTION

1. Field of the Invention

The present invention relates to a semiconductor integrated circuit device operating in synchronism with a clock and a method for controlling the duty of the clock. For example, the present invention relates to a method for controlling the duty of the clock in a processor core including a critical path that is active while the clock is at an "H" level and a critical path that is active while the clock is an "L" level.

2. Description of the Related Art

In recent years, the operating speed of semiconductor integrated circuits (LSI) has been remarkably increased. With the increased operating speed of the semiconductor integrated circuits, processors have been commonly used which operate in synchronism with both rising edge and falling edge of a clock.

In LSIs using these processors, the duty of the clock has a significant effect on the operation characteristics, yield, and the like of the LSI. It is thus important to appropriately adjust the duty, and relevant proposals have been made by, for example, Jpn. Pat. Appln, KOKAI Publication No. 2005-159613 and Jpn. Pat. Appln. KOKAI Publication No. 2004-088434.

However, these conventional techniques are not sufficient in terms of the appropriate adjustment of the duty. It has thus been difficult to further improve the operating speed of LSIs operating at higher frequencies.

Furthermore, systems using semiconductor devices or the like often require a basic clock having a duty of 50%. However, the optimum duty of high-speed clocks exceeding, for example, a GHz order is not always 50%. A duty of a different value is often required. Thus, a configuration for controlling the duty is disclosed in, for example, the sixth page of the specification and FIG. 8 of Jpn. Pat. Appln. KOKOKU Publication No. 7-114349.

This conventional configuration enables the duty to be controlled by varying the resistance ratio of resistance elements in a voltage setting circuit. However, the configuration requires the resistance ratio to be preset. Thus, if the duty of an input signal deviates from a set value, the duty of an output signal changes correspondingly. Obtaining the desired duty has thus been difficult.

BRIEF SUMMARY OF THE INVENTION

A semiconductor integrated circuit device according to an aspect of the present invention includes:

a processor core operating in synchronism with a first clock and including a first critical path which is active while the first clock is at an "H" level and a second critical path which is active while the first clock is at an "L" level;

a first clock generating section controlling a duty of an externally input second clock to generate the first clock; and a control section detecting a first phase difference between the first clock and a third clock obtained by delaying the first clock by a delay time occurring on the first critical path and a second phase difference between the first clock and a fourth clock obtained by delaying the first clock by a delay time occurring on the second critical path, the control section instructing the first clock generating section to control the duty so as to minimize a difference between the first phase difference and the second phase difference.

A method for controlling a duty of a first clock operating a processor core according to an aspect of the present invention, the method includes:

generating a first clock on the basis of an externally input second clock;

allowing the processor core to generate a third clock by delaying the first clock by a delay time occurring on a first critical path which is active while the first clock is at an "H" level;

allowing the processor core to generate a fourth clock by delaying the first clock by a delay time occurring on a second critical path which is active while the first clock is at an "L" level;

detecting a first phase difference between the first clock and the third clock;

detecting a second phase difference between the first clock and the fourth clock; and controlling a duty of the first clock so as to minimize a difference between the first phase difference and the second phase difference.

BRIEF DESCRIPTION OF THE SEVERAL VIEWS OF THE DRAWING

FIG. 1 is a block diagram of LSI according to a first embodiment of the present invention;

FIG. 5 is a timing chart of a first clock obtained when the duty control method according to the first embodiment of the present invention is used and when the duty control method is not used;

FIG. 6 is a block diagram of LSI according to a second embodiment of the present invention;

FIG. 8 is a block diagram of LSI according to a third embodiment of the present invention;

FIG. 12 and FIG. 13 are timing charts of various signals obtained when the duty control method according to the third embodiment of the present invention is executed;

FIGS. 18 to 21 are timing charts of signals provided by the duty adjuster according to the fourth embodiment of the present invention;

DETAILED DESCRIPTION OF THE INVENTION

First Embodiment

Figure 2:
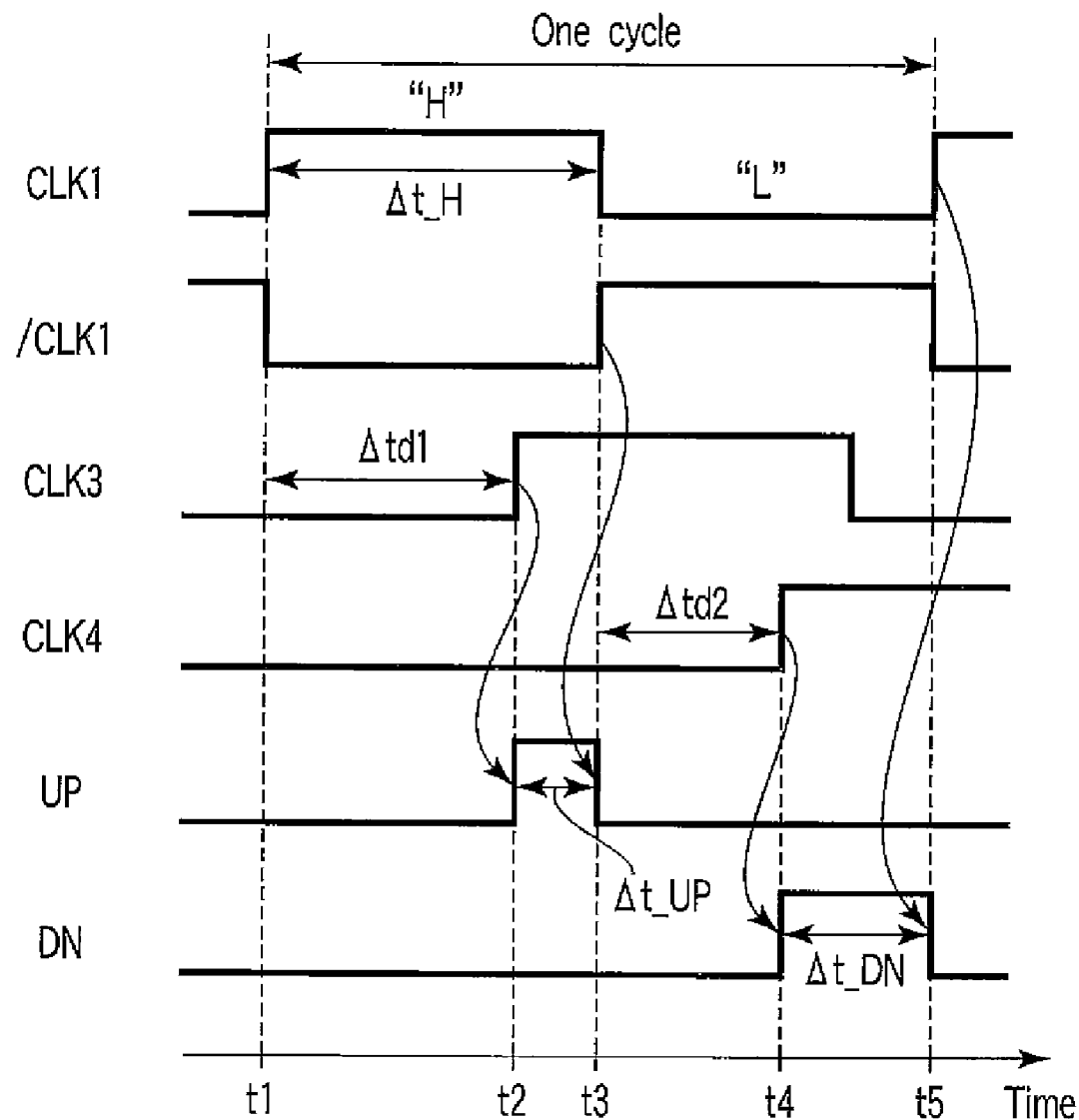
FIG. 2 is a timing chart of various signals used in LSI according to the first embodiment of the present invention.

With reference to FIG. 1, description will be given of a semiconductor integrated circuit device and a duty control method according to a first embodiment of the present invention. FIG. 1 is a block diagram of LSI according to the present embodiment.

As shown in the figure, LSI 1 includes a processor core 2, a duty adjuster 3, and a control section 4.

The processor core 2 operates in synchronism with a first clock CLK1 generated by the duty adjuster 3. The processor core 2 includes a plurality of logic circuits including flip flops 10 and combinatorial circuits 11. Some of the logic circuits are active while the first clock CLK1 is at an "H" level, that is, operate in synchronism with a rising edge of the first clock CLK1. The other logic circuits are active while the first clock CLK1 is at an "L" level, that is, operate in synchronism with a falling edge of the first clock CLK1. Each of the logic circuits performing the respective operations has critical paths. The critical paths are paths requiring the longest time to propagate signals and determining the operating speed of the processor core 2. A critical path for paths that are active while the first clock CLK1 is at the "H" level is hereinafter referred to as a first critical path 12. A critical path for paths that are active while the first clock CLK1 is at the "L" level is hereinafter referred to as a second critical path 13.

The first and second critical paths 12 and 13 have predetermined delay times Δtd1 and Δtd2, respectively. That is, the first clock CLK1 is delayed by Δtd1 upon passing through the first critical path 12. The first clock CLK1 is delayed by Δtd2 upon passing through the second critical path 13. The first clock CLK1 delayed by the first critical paths 12 is called a third clock CLK3. The first clock CLK1 delayed by the second critical path 13 is called a fourth clock CLK4.

The duty adjuster 3 adjusts the duty of an externally provided second clock CLK2 and supplies the adjusted second clock CLK2 to the processor core 2 as the first clock CLK1. The duty is the rate of a period when the clock is at the "H" level, during one cycle of the clock. The duty adjuster 3 controls the duty of the second clock CLK2 in accordance with a control signal CNT provided by the control section 4. The dusty adjuster 3 according to the present embodiment controls the duty by adjusting the rise timing of the second clock CLK2.

The control section 4 includes an inverter 20, a first phase comparator 21, a second phase comparator 22, a charge pump circuit 23, and a low pass filter 24. The inverter 20 inverts the first clock CLK1 generated by the duty adjuster 2. For simplification of description, an output from the inverter 20 is hereinafter referred to as a first clock /CLK1.

The first phase comparator 21 detects the phase difference between the first clock /CLK1 and the third clock CLK3, output by the processor core 2, to output a first phase difference signal UP in accordance with the detected phase difference. More specifically, the first phase comparator 21 detects, for example, the phase difference between the rise timing of the first clock /CLK1 and the rise timing of the third clock CLK3.

The second phase comparator 22 detects the phase difference between the first clock CLK1 and the fourth clock CLK4, output by the processor core 2, to output a second phase difference signal DN in accordance with the detected phase difference. More specifically, the second phase comparator 22 detects, for example, the phase difference between the rise timing of the first clock CLK1 and the rise timing of the fourth clock CLK4.

The charge pump circuit 23 generates voltages in accordance with the first and second phase difference signals UP and DN, output by the first and second phase comparators 21 and 22, respectively. The voltages are provided to the duty adjuster 2 via the low pass filter 24 as a control signal CNT. In other words, the charge pump circuit 23 and the low pass filter 24 converts the phase difference between the phase difference between the first clock CLK1 and the third clock CLK3 and the phase difference between the phase difference between the first clock CLK1 and the fourth clock CLK4 into voltages. The voltages control the adjustment of the duty in the duty adjuster 2.

Now, with reference to FIG. 2, description will be given of the details of the first clocks CLK1 and /CLK1, the third clock CLK3, the fourth clock CLK4, the first phase difference signal UP, and the second phase difference signal DN, as well as a method by which the duty adjuster 2 adjusts the duty. FIG. 2 is a timing chart of these various signals.

As shown in the figure, the first clock CLK1 rises at a time t1, falls at a time t3, and rises at a time t5 again. That is, the period of one cycle corresponds to the length between the time t1 and the time t5. The duty adjuster 2 adjusts the length Δt_H of the period when the first clock CLK1 is at the "H" level.

The third clock CLK3 is a signal that rises Δtd1 later than a rise timing (time t1) of the first clock CLK1. For example, the third clock CLK3 rises at a time t2.

The fourth clock CLK4 is a signal that rises Δtd2 later than a fall timing (time t3) of the first clock CLK1. For example, the fourth clock CLK3 rises at a time t4.

The first phase difference signal UP is at the "H" level during a period between the rise timing (time t2) of the third clock CLK3 and the fall timing of the first clock CLK1, that is, the rise timing (time t3) of the first clock /CLK1. This period is hereinafter referred to as Δt_UP.

The second phase difference signal DN is at the "H" level during a period between the rise timing (time t4) of the fourth clock CLK4 and the rise timing (time t5) of the first clock CLK1. This period is hereinafter referred to as Δt_DN.

The duty adjuster 2 adjusts Δt_H of the first clock CLK1, that is, the duty of the first clock CLK1, so as to set the difference between Δt_UP and Δt_DN at the minimum value, preferably to make Δt_UP and Δt_DN equal. That is, for Δt_UP<Δt_DN, the duty adjuster 2 increases Δt_H (increases the duty). For Δt_UP>Δt_DN, the duty adjuster 2 reduces Δt_H (reduces the duty). The above-described minimum value is the minimum value that can be set by the duty adjuster 3.

Figure 3:
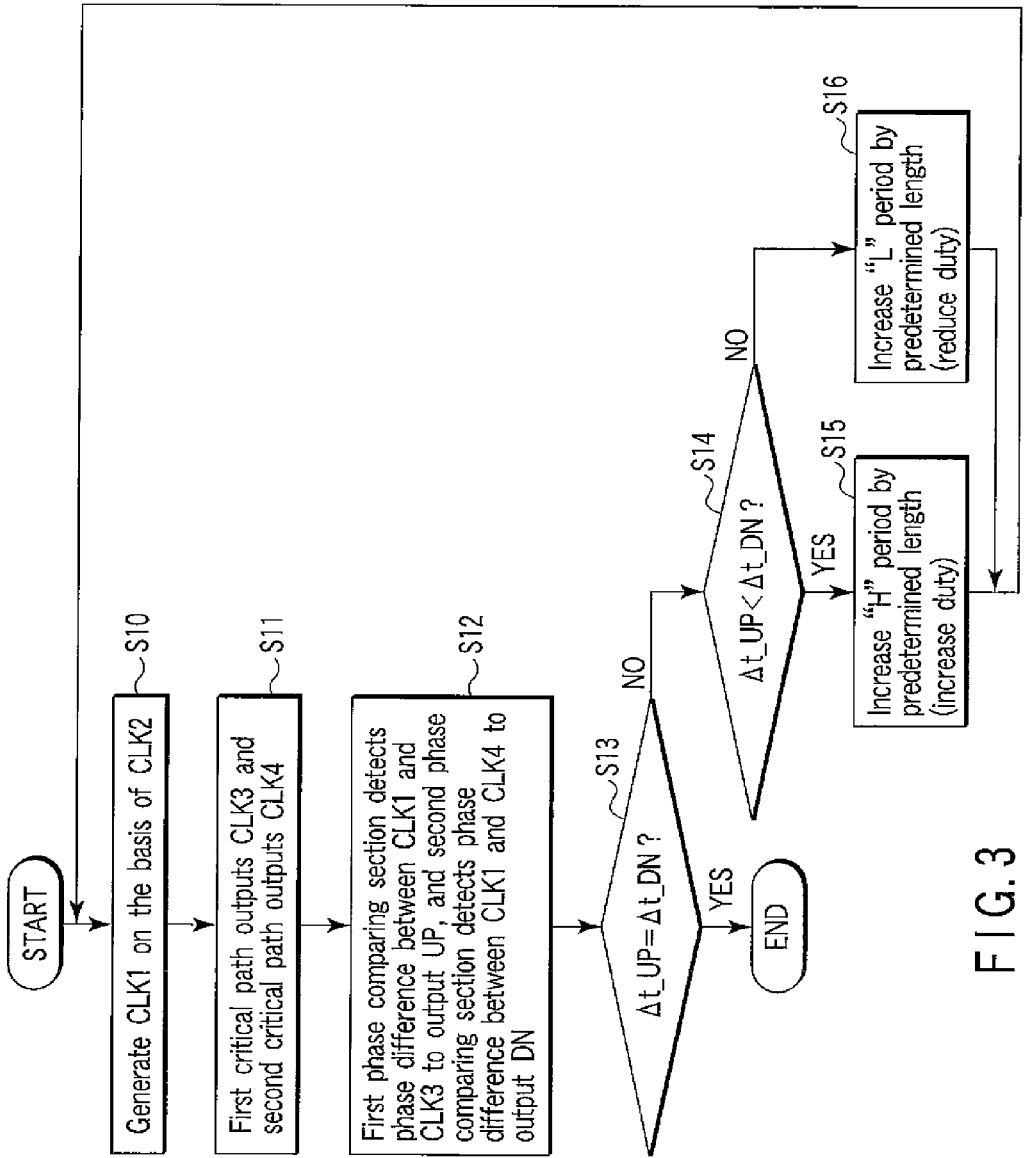
FIG. 3 is a flowchart of a duty control method according to the first embodiment of the present invention.

The method for adjusting the duty in LSI configured as described above will be described in detail with reference to FIG. 3. FIG. 3 is a flowchart of the duty adjusting method.

As shown in the figure, when the external second clock CLK2 is input to LSI, the duty adjuster 3 generates the first clock CLK1 on the basis of the second clock CLK2 (step S10). The duty of the initially generated first clock CLK1 may be the same as that of the second clock CLK2 or may be adjusted to a predetermined value under the control of the control section 4.

The duty adjuster 3 provides the first clock CLK1 to the processor core 2 to allow the first critical path 12 to output the third clock CLK3, while allowing the second critical path 13 to output the fourth clock CLK4 (step S11). The third clock CLK3 and the fourth clock CLK4 are provided to a first phase comparing section 21 and a second phase comparing section 22, respectively.

The first phase comparing section 21 then detects the phase difference between the first clock CLK1 (actually /CLK1) and the third clock CLK3 to output the first phase difference signal UP. The second phase comparing section 22 then detects the phase difference between the first clock CLK1 and the fourth clock CLK4 to output the second phase difference signal DN (step S12).

If $\Delta t\_UP$ is smaller than $\Delta t\_DN$ (step S13, NO, step S14, YES), the charge pump circuit 23 and the low pass filter 24 generate the control signal CNT allowing the period when the clock is at the "H" level to be increased by a predetermined length $\Delta t$ and outputs the control signal CNT to the duty adjuster 3. On the basis of the control signal CNT, the duty adjuster 3 increases the period when the second clock CLK2 is at the "H" level. That is, the duty of the first clock CLK1 is increased (step S15).

If $\Delta t\_UP$ is greater than $\Delta t\_DN$ (step S13, NO, step S14, NO), the charge pump circuit 23 and the low pass filter 24 generate the control signal CNT allowing the period when the clock is at the "H" level to be reduced by the predetermined length $\Delta t$ and outputs the control signal CNT to the duty adjuster 3. On the basis of the control signal CNT, the duty adjuster 3 reduces the period when the second clock CLK2 is at the "H" level. That is, the duty of the first clock CLK1 is reduced (step S16).

The process then returns to step S10 to repeat the above-described processing until $\Delta t\_UP=\Delta t\_DN$ (step S13, YES).

The value of the predetermined length $\Delta t$ in steps S15 and S16 may be always fixed or repeatedly reduced or reduced when the magnitude correlation between $\Delta t\_UP$ and $\Delta t\_DN$ is inverted.

Figure 4:
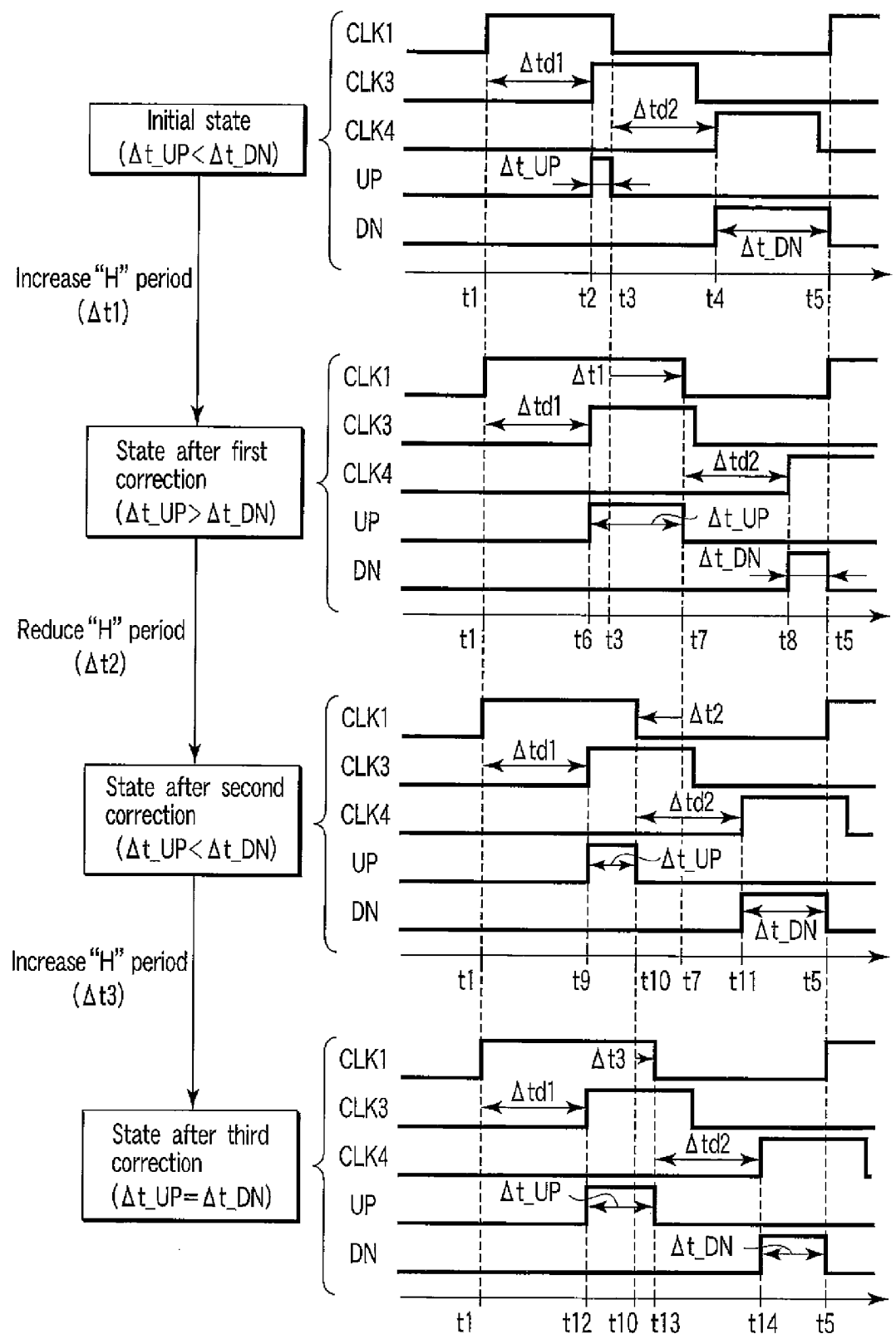
FIG. 4 is a timing chart of various signals obtained when the duty control method according to the first embodiment of the present invention is executed.

A specific example of the adjusting method will be described with reference to FIG. 4. FIG. 4 is a timing chart of the first clock CLK1, third clock CLK3, fourth clock CLK4, first phase difference signal UP, and second phase difference signal DN observed during duty adjustment, showing that the duty is optimized through three adjustments. FIG. 4 shows that $\Delta t$ is reduced when the magnitude correlation between $\Delta t\_UP$ and $\Delta t\_DN$ is inverted.

As shown in FIG. 4, for the first clock CLK1 initially generated on the basis of the second clock CLK2, $\Delta t\_UP<\Delta t\_DN$ (step S14, YES). That is, in this condition, the period when the first clock CLK1 is at the "H" level is too short. This corresponds to an "initial state" shown in the figure.

Thus, the duty adjuster 3 then increases the period when the first clock CLK1 is at the "H" level by $\Delta t1$. This corresponds to a "state after the first correction". That is, the fall timing of the first clock CLK1 changes from the time t3 to a time t7.

This correction results in $\Delta t\_UP>\Delta t\_DN$ (step S14, NO). That is, the period when the first clock CLK1 is at the "L" level is too short.

Thus, the duty adjuster 3 then reduces the period when the first clock CLK1 is at the "H" level by $\Delta t2$. This corresponds to a "state after the second correction". That is, the fall timing of the first clock CLK1 changes from the time t7 to a time t10. Compared to the shift from the initial state to the state after the first correction, the shift from the state after the first correction to the state after the second correction inverts the magnitude correlation between $\Delta t\_UP$ and $\Delta t\_DN$. The duty adjuster 3 thus sets the value of $\Delta t2$ smaller than that of $\Delta t1$. This correction results in $\Delta t\_UP<\Delta t\_DN$ (step S14, YES). That is, the period when the first clock CLK1 is at the "H" level is too short.

Thus, the duty adjuster 3 then increases the period when the first clock CLK1 is at the "H" level by $\Delta t3$. This corresponds to a "state after the third correction". That is, the fall timing of the first clock CLK1 changes from the time t10 to a time t13. In this case, $\Delta t3<\Delta t2$. This correction results in $\Delta t\_UP=\Delta t\_DN$ (step S13, YES). Thus, the adjustment of the duty is finished. The duty adjuster 3 subsequently generates the first clock CLK1 that is at the "H" level between the time t1 and the time t13.

As described above, the duty adjusting method according to the first embodiment of the present invention exerts an effect (1).

(1) The operating speed of LSI can be increased.

With the configuration according to the present embodiment, the control section 4 monitors the phase difference between the first clock CLK1 and the third clock CLK3 and the phase difference between the first clock CLK1 and the fourth clock CLK4. The control section 4 commands the duty adjuster 3 to adjust the duty so as to make these phase differences equal. This enables a drastic increase in the operating speed of LSI. This effect will be described below in detail.

As described in FIG. 2, $\Delta t\_UP$ is the period between the rise of the third clock CLK3 and the fall of the first clock CLK1. The third clock CLK3 rises at the timing when a delay time in the critical path 12 has elapsed since the rise of the first clock CLK1. That is, to allow the first critical path 12 to operate correctly, $\Delta t\_H$ of the first clock CLK1 must be set at least equal to or greater than $\Delta td1$. In other words, the phase difference $\Delta t\_UP$ between the first clock CLK1 and the third clock CLK3 means an operational margin on the first critical path 12 for the first clock CLK1.

Naturally, the logic circuits that are active while the first clock CLK1 in the processor core 2 is at the "H" level do not operate correctly unless the first clock CLK1 allows at least the first critical path 12 to operate correctly. This is because the first critical path 12 suffers the longest delay in these logic circuits.

This also applies to $\Delta t\_DN$. That is, to allow the second critical path 13 to operate correctly, the period of the "L" level during one cycle of the first clock CLK1 must be set at least equal to or greater than $\Delta td2$. That is, the phase difference $\Delta t\_DN$ between the first clock CLK1 and the fourth clock CLK4 also means an operational margin on the second critical path 13 for the first clock CLK1. The logic circuits that are active while the first clock CLK1 in the processor core 2 is at the "L" level do not operate correctly unless the first clock CLK1 allows at least the second critical path 13 to operate correctly.

In this connection, with the configuration according to the present embodiment, the control section 4 makes $\Delta t\_UP$ and $\Delta t\_DN$ equal (sets $\Delta t\_UP$ and $\Delta t\_DN$ at the minimum possible value provided by the duty adjuster 3). This enables the frequency of the first clock CLK1 to be maximized. This is shown in FIG. 5. FIG. 5 is a timing chart showing two cases (CASE1 and CASE2) in which the frequency of the first clock CLK1 is increased. CASE1 is the case of $\Delta t\_UP \ll \Delta t\_DN$. CASE2 is the case of $\Delta t\_UP = \Delta t\_DN$ based on the method according to the present embodiment.

As shown in the figure, it is assumed that the period of one cycle of the first clock CLK1 is $\Delta tc1$. In either CASE1 or CASE2, the period when the first clock CLK1 is at the "H" level must be equal to or longer than $\Delta td1$. The period when the first clock CLK1 is at the "L" level must be equal to or longer than $\Delta td2$.

In CASE1, a sufficient operational margin ($\Delta t\_DN$) is present during the "L" level period. Almost no operational margin ($\Delta t\_UP$) is present during the "H" level period. As a result, the frequency of the first clock CLK1 is limited to $\Delta t\_UP$ and cannot be substantially increased.

In CASE2, $\Delta t\_UP = \Delta t\_DN$. Consequently, the period when the first clock CLK1 is at the "H" level can be set to $\Delta td1$. The period when the first clock CLK1 is at the "L" level can be set to $\Delta td2$. This allows the frequency of the first clock CLK1 to be maximized ($\Delta tc3 \ll \Delta tc3$). The operating speed of LSI can thus be increased.

Second Embodiment

Now, description will be given of a semiconductor integrated circuit device and a duty control method according to a second embodiment of the present invention. The present embodiment corresponds to the first embodiment having a replica circuit for the first and second critical paths 12 and 13. FIG. 6 is a block diagram of LSI according to the present embodiment.

As shown in FIG. 6, LSI 1 according to the present embodiment corresponds to the configuration in FIG. 1 described in the first embodiment and which additionally has a replica circuit 5. Instead of the processor core 2, the replica circuit 5 outputs the third clock CLK3 and the fourth clock CLK4.

The replica circuit 5 includes circuits similar to the first critical path 12 and second critical path 13 in the processor core 2, that is, replicas of the paths 12 and 13. In FIG. 6, a first delay circuit 30 in the replica circuit 5 is the replica of the first critical path 12. A second delay circuit 31 in the replica circuit 5 is the replica of the second critical path 13. The duty adjuster 3 inputs the first clock CLK1 to the first and second delay circuits 30 and 31. The first and second delay circuits 30 and 31 output the third and fourth clocks CLK3 and CLK4.

The remaining part of the configuration is similar to that in the first embodiment and will thus not be described below.

Figure 7:
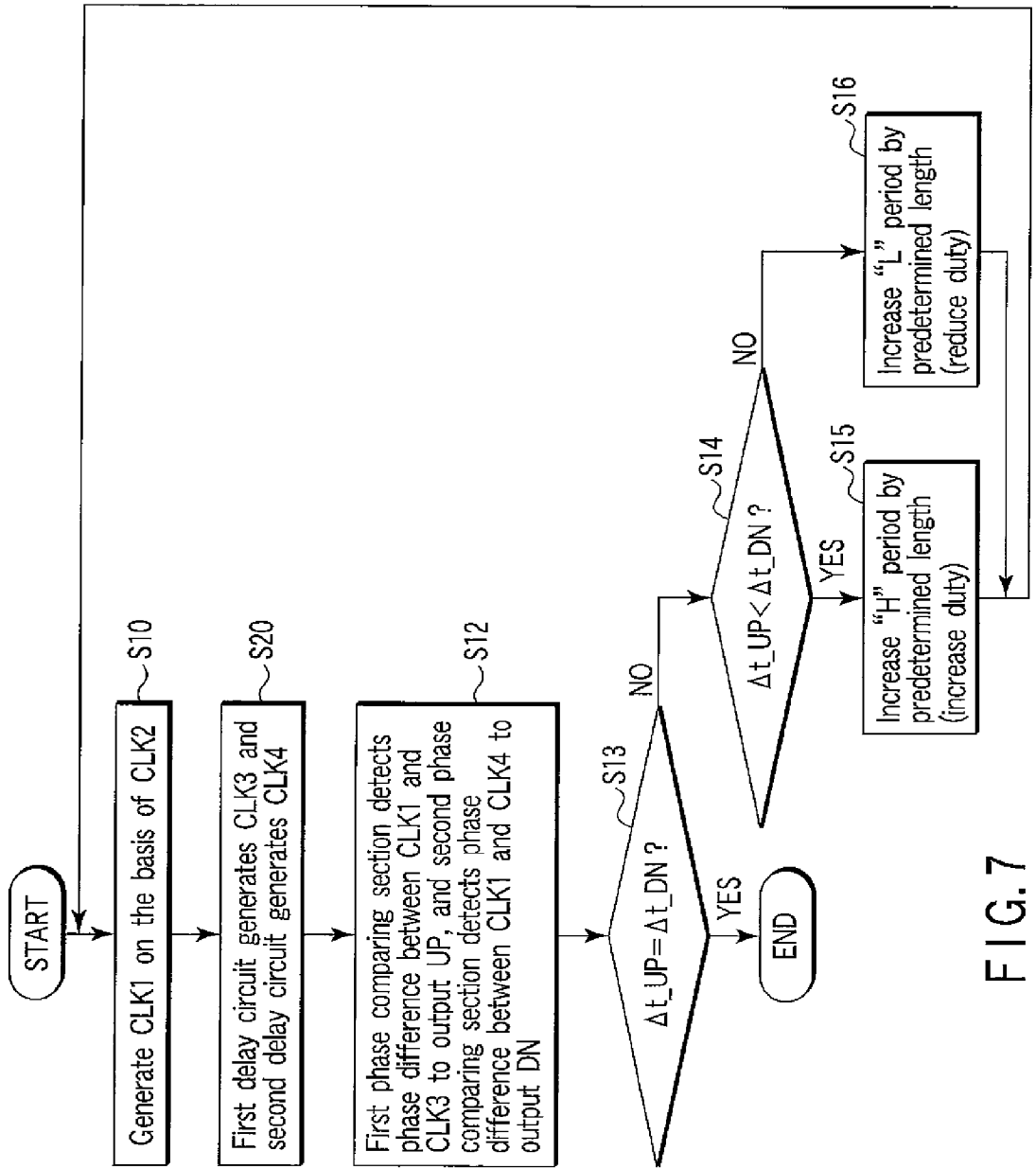
FIG. 7 is a flowchart of a duty control method according to the second embodiment of the present invention.

Now, a duty adjusting method for LSI according to the present embodiment will be described with reference to FIG. 7. FIG. 7 is a flowchart of the duty adjusting method.

As shown in the figure, FIG. 7 differs from FIG. 3, described in the first embodiment, in that the third clock CLK3 and the fourth clock CLK4 are generated by the first delay circuit 30 and the second delay circuit 31 (step S20). The remaining part of the method in FIG. 7 is similar to that in FIG. 3.

As described above, the duty adjusting method according to the present embodiment exerts not only the effect (1) described in the first embodiment but also an effect (2).

(2) The operational reliability of LSI is maintained, while exerting the effect (1).

With the configuration according to the present embodiment, the third and fourth clocks CLK3 and CLK4, used by the control section 4, are generated by the replica circuit 5. That is, the processor core 2 has nothing to do with the operation of the control section 4. Thus, even if a failure or the like occurs in the control section 4 for any reason to affect the replica circuit 5, the adverse effect is not exerted on the processor core 2. This makes it possible to prevent the operation of the processor core 2 from being affected, preventing the operational reliability of LSI from being degraded.

In the above-described embodiment, the first and second delay circuits 30 and 31 are the replicas proper of the first and second critical paths 12 and 13. However, the present embodiment is not limited to this. That is, the first and second delay circuits 30 and 31 may be provided in the replica circuit 5 separately from the first and second critical paths 12 and 13. The first and second delay circuits 30 and 31 may be used only to generate the third and fourth clocks CLK3 and CLK4 using the first and second critical paths 12 and 13.

Third Embodiment

Now, description will be given of a semiconductor integrated circuit device and a duty control method according to a third embodiment of the present invention. The present embodiment corresponds to the first embodiment having a replica circuit for the first and second critical paths 12 and 13 and digitally adjusts the duty. FIG. 8 is a block diagram of LSI according to the present embodiment.

As shown in FIG. 8, LSI 1 according to the present embodiment includes the processor core 2, the duty adjuster 3, the control section 4, and the replica circuit 5. The configuration of the processor core 2 is as described in the first embodiment. However, the processor core 2 need not output the third clock CLK3 or the fourth clock CLK4 to any external circuit. The duty adjuster 3 also has a configuration similar to that described in the first embodiment and adjusts the duty in accordance with the control signal CNT, provided by the control section 4. A specific duty adjusting method will be described below.

As in the case of the second embodiment, the replica circuit 5 includes the replica of the first critical path 12 and the replica of the second critical path 13. The replica circuit 5 further includes a third delay circuit 32 and a fourth delay circuit 33. The third delay circuit 32 generates a fifth clock CLK5 on the basis of the first clock CLK1. The fifth clock CLK5 corresponds to the first clock CLK1 delayed by a time that is several percents longer than the delay time $\Delta td1$, occurring on the first critical path 12. The fourth delay circuit 33 generates a sixth clock CLK6 on the basis of the first clock CLK1. The sixth clock CLK6 corresponds to the first clock CLK1 delayed by a time that is several percents longer than the delay time $\Delta td2$, occurring on the second critical path 13.

The control section 4 includes the inverter 20, the first and second phase comparing sections 21 and 22, and a counter circuit 25. The inverter 20 inverts the first clock CLK1 as is the case with the first embodiment.

The first phase comparing section 21 detects the phase difference between the first clock /CLK1 and the fifth clock CLK5, output by the replica circuit 5, to output the first phase difference signal UP in accordance with the detected phase difference. More specifically, the first phase comparing section 21 detects, for example, the phase difference between the rise timing of the fifth clock /CLK1 and a rise timing of the fifth clock CLK5.

The second phase comparing section 22 detects the phase difference between the first clock CLK1 and the sixth clock CLK6, output by the replica circuit 5, to output the second phase difference signal DN in accordance with the detected phase difference. More specifically, the second phase comparing section 22 detects, for example, the phase difference between the rise timing of the first clock CLK1 and a rise timing of the sixth clock CLK6.

In each step during the duty adjustment, the counter circuit 25 counts the first phase difference signal UP, output by the first phase comparing section 21, and the second phase difference signal DN, output by the second phase comparing section 22. The counter circuit 25 then outputs the control signal CNT based on whether the first phase difference signal UP or the second phase difference signal DN has been counted; the control signal CNT controls the duty adjuster 3.

Figure 9:
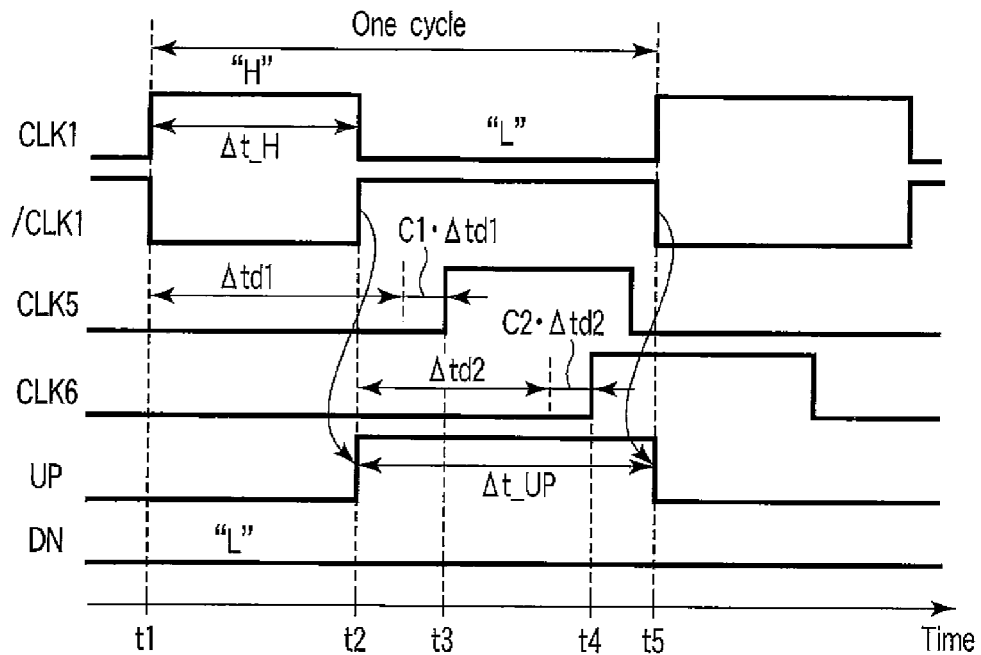
FIG. 9 is a timing chart of various signals used in LSI according to the third embodiment of the present invention.
Figure 10:
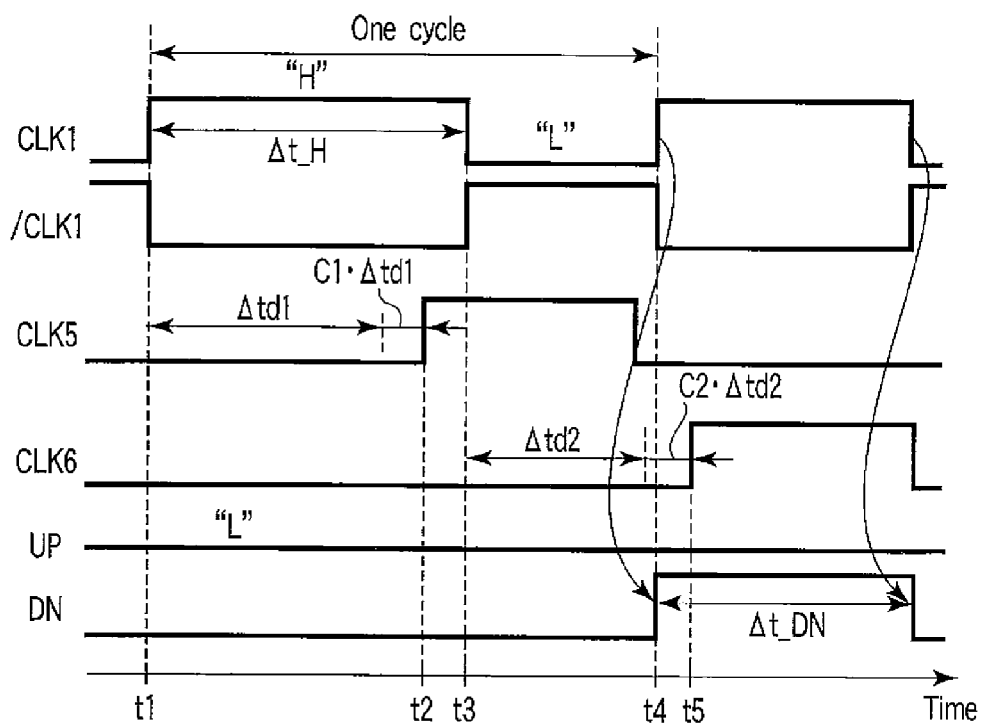
FIG. 10 is a timing chart of the various signals used in LSI according to the third embodiment of the present invention.

Now, with reference to FIGS. 9 and 10, description will be given of the details of the first clocks CLK1 and /CLK1, the fifth clock CLK5, the sixth clock CLK6, the first phase difference signal UP, and the second phase difference signal DN, as well as a method by which the duty adjuster 2 adjusts the duty. FIGS. 9 and 10 are timing charts of these various signals.

First, the case shown in FIG. 9 will be described. As shown in the figure, the first clock CLK1 rises at the time t1, falls at the time t2, and rises at the time t5 again. That is, the period of one cycle corresponds to the length between the time t1 and the time t5. The duty adjuster 2 adjusts the length $\Delta t\_H$ of the period when the first clock CLK1 is at the "H" level.

The fifth clock CLK5 is a signal that rises ($\Delta td1 + C1 \cdot \Delta td1$) after the rise timing (time t1) of the first clock CLK1. For example, C1=about 0.01 to 0.09, and the fifth clock CLK5 rises at the time t3. That is, if for example, C1=0.01, the fifth dock CLK5 is a signal that rises a certain delay time later than the rising edge of the first clock CLK1, the delay time being 1% longer than $\Delta td1$.

The sixth clock CLK6 is a signal that rises ($\Delta td2 + C2 \cdot \Delta td2$) later than the fall timing (time t2) of the first clock CLK1. For example, C2=about 0.01 to 0.09, and the sixth clock CLK6 falls at the time t4. That is, the sixth clock CLK6 is a signal which, if for example, C2=0.01, rises a certain delay time later than the falling edge of the first clock CLK1, the delay time being 1% longer than $\Delta td2$.

The first phase difference signal UP is set to the "H" level at the fall timing of the first clock CLK1 if the fall timing of the first clock CLK1 (that is, the rise timing of the first clock /CLK1) is earlier than the rise timing of the fifth clock CLK5. Thus, in FIG. 9, the first phase difference signal UP rises at the time t2. The first phase difference signal UP falls to the "L" level at the rise timing of the first clock CLK1 (that is, the fall timing of the first clock /CLK1). The period when the first phase difference signal UP is at the "H" level is hereinafter referred to as $\Delta t\_UP$.

The first phase difference signal UP is set to the "H" level at the rise timing of the first clock CLK1 if the rise timing of the first clock CLK1 is earlier than the rise timing of the sixth clock CLK6, Thus, in FIG. 9, the second phase difference signal DN is always at the "L" level.

Now, the case shown in FIG. 10 will be described. In contrast to FIG. 9, FIG. 10 shows that the second phase difference signal DN is set to the "H" level. As shown in FIG. 10, the first clock CLK1 rises at the time t1, falls at the time t3, and rises at the time t4 again.

The rising edge of the fifth clock CLK5 occurs earlier than the falling edge of the first clock CLK1 (time t2). The sixth clock CLK6 rises later than the rise timing of the first clock CLK1 (time t5). As a result, the first phase difference signal UP is always at the "L" level. On the other hand, the second phase difference signal DN is set to the "H" level at the rise timing of the first clock CLK1 (time t4). The second phase difference signal DN falls to the "L" level at the fall timing of the first clock CLK1. The period when the second phase difference signal DN is at the "H" level is hereinafter referred to as $\Delta t\_DN$.

The duty adjuster 3 increase $\Delta t\_H$ of the first clock CLK1 for UP="H" (increases the duty) and reduces $\Delta t\_H$ for DN="H" (reduces the duty).

Figure 11:
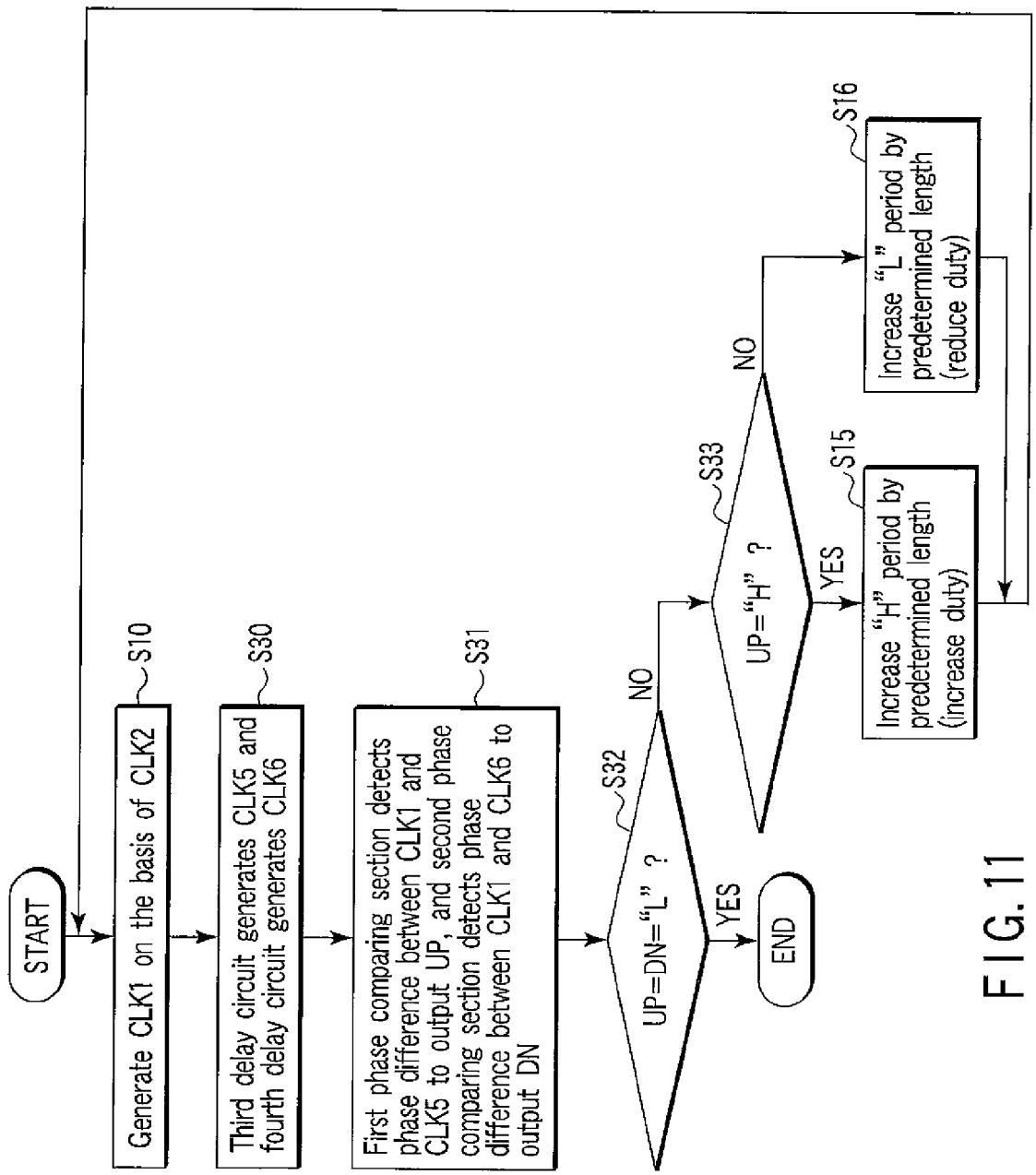
FIG. 11 is a flowchart of a duty control method according to the third embodiment of the present invention.

Now, a duty adjusting method for LSI according to the present embodiment will be described in detail with reference to FIG. 11. FIG. 11 is a flowchart of the duty adjusting method.

As shown in the figure, first, the first clock CLK1 is generated (step S10). The duty adjuster 3 provides the first clock CLK1 to the processor core 2 to allow the third delay circuit 32 to output the fifth clock CLK5, while allowing the fourth delay circuit 33 to output the sixth clock CLK6 (step S30). The fifth clock CLK5 and the sixth clock CLK6 are provided to the first phase comparing section 21 and the second phase comparing section 22, respectively.

The first phase comparing section 21 then detects the phase difference between the first clock CLK1 (actually /CLK1) and the fifth clock CLK5. If the fall timing of the first clock CLK1 is earlier than the rise timing of the fifth clock CLK5, the first phase comparing section 21 sets the first phase difference signal UP to the "H" level. The second phase comparing section 22 detects the phase difference between the first clock CLK1 and the sixth clock CLK6. If the rise timing of the first clock CLK1 is earlier than the rise timing of the sixth clock CLK6, the second phase comparing section 22 sets the second phase difference signal DN to the "H" level (step S31).

If the first phase difference signal UP is at the "H" level, that is, if DN="L" (step S32, NO, step S33, YES), the counter circuit 25 performs the corresponding counting operation. That is, the count for the first phase difference signal UP is incremented. The counter circuit 25 then generates the control signal CNT allowing the period when the clock is at the "H" level to be increased by the predetermined length $\Delta t$ and outputs the control signal CNT to the duty adjuster 3. On the basis of the control signal CNT, the duty adjuster 3 increases the period when the second clock CLK2 is at the "H" level. That is, the duty of the first clock CLK1 is increased (step S15).

If the first phase difference signal DN is at the "H" level, that is, if UP="L" (step S32, NO, step S33, NO), the counter circuit 25 performs the corresponding counting operation. That is, the count for the second phase difference signal DN is incremented. The counter circuit 25 then generates the control signal CNT allowing the period when the clock is at the "H" level to be reduced by the predetermined length $\Delta t$ and outputs the control signal CNT to the duty adjuster 3. On the basis of the control signal CNT, the duty adjuster 3 reduces the period when the second clock CLK2 is at the "H" level. That is, the duty of the first clock CLK1 is reduced (step S16).

The process then returns to step S10 to repeat the above-described processing until both the first and second phase difference signals UP and DN are set to the "L" level (step S32, YES).

The predetermined length $\Delta t$ in steps S15 and S16 is always fixed. Of course, $\Delta t$ may be varied for every duty adjustment.

A specific example of the adjusting method will be described below in connection with the case (CASE1) in which the duty is optimized by increasing $\Delta t\_H$ and the case (CASE2) in which the duty is optimized by reducing $\Delta t\_H$.

(CASE1)

First, CASE1 will be described with reference to FIG. 12. FIG. 12 is a timing chart of the first clock CLK1, fifth clock CLK5, sixth clock CLK6, first phase difference signal UP, and second phase difference signal DN observed during duty adjustment, showing that the duty is optimized through three adjustments. FIG. 12 shows that Δt in steps S15 and S16 is fixed at Δt4. (Δtd1+C1·Δtd1) is represented as Δtd3 and (Δtd2+C2·Δtd2) is represented as Δtd4.

As shown in FIG. 12, the first clock CLK1 initially generated on the basis of the second clock CLK2 falls (time t2) before the rise timing (time t3) of the fifth clock CLK5. Accordingly, the first phase difference signal UP="H" and the second phase difference signal DN="L" (step S33, YES). That is, in this condition, the period when the first clock CLK1 is at the "H" level is too short. This corresponds to the "initial state" shown in the figure.

Thus, the duty adjuster 3 then increases the period when the first clock CLK1 is at the "H" level by Δt4. This corresponds to the "state after the first correction". That is, the fall timing of the first clock CLK1 changes from the time t2 to a time t6. However, the fall timing (time t6) of the first clock CLK1 is still earlier than the rise timing (time t3) of the fifth clock CLK5. Accordingly, the first phase difference signal UP="H" and the second phase difference signal DN="L" (step S33, YES). That is, in this condition, the period when the first clock CLK1 is at the "H" level is still too short.

Thus, the duty adjuster 3 further increases the period when the first clock CLK1 is at the "H" level by Δt4. This corresponds to the "state after the second correction". That is, the fall timing of the first clock CLK1 changes from the time t2 to a time t8. However, the fall timing (time t8) of the first clock CLK1 is still earlier than the rise timing (time t3) of the fifth clock CLK5. Accordingly, the first phase difference signal UP="H" and the second phase difference signal DN="L" (step S33, YES). That is, in this condition, the period when the first clock CLK1 is at the "H" level is still too short.

Thus, the duty adjuster 3 further increases the period when the first clock CLK1 is at the "H" level by Δt4. This corresponds to the "state after the third correction". That is, the fall timing of the first clock CLK1 changes from the time t2 to the time t3. As a result, the fall timing of the first clock CLK1 is the same as the rise timing (time t3) of the fifth clock CLK5. Accordingly, the first phase difference signal UP="L" and the second phase difference signal DN="L" (step S32, YES). Thus, the adjustment of the duty is finished. The duty adjuster 3 subsequently generates the first clock CLK1 that is at the "H" level between the time t1 and the time t3.

After the third correction in FIG. 12, the fall timing of the first clock CLK1 is the same as the rise timing of the fifth clock CLK5. However, of course, the fall timing of the first clock CLK1 may be later than the rise timing of the fifth clock CLK5.

(CASE2)

Figure 13:
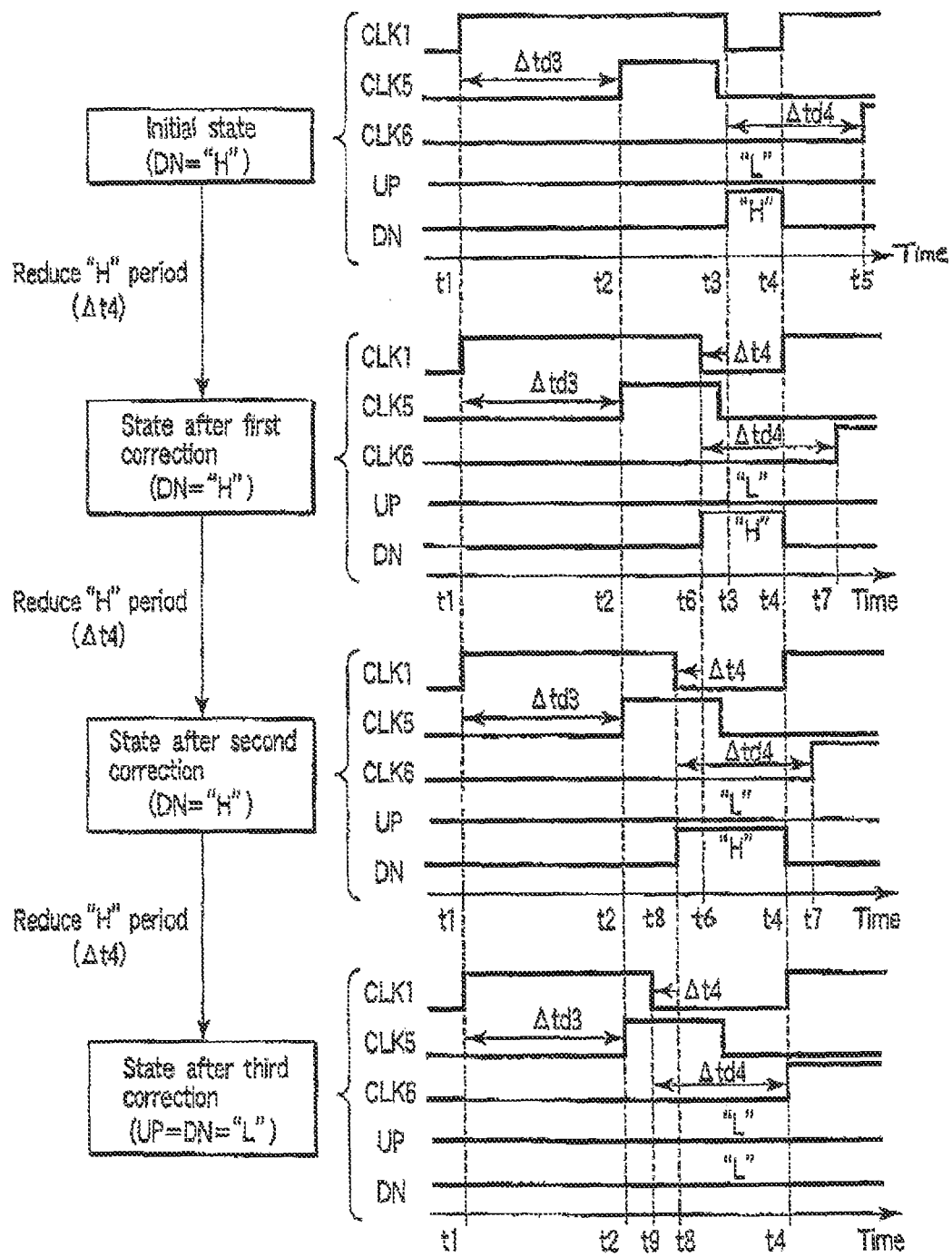

Now, CASE2 will be described with reference to FIG. 13. FIG. 13 is a timing chart of the first clock CLK1, fifth clock CLK5, sixth clock CLK6, first phase difference signal UP, and second phase difference signal DN observed during duty adjustment, showing that the duty is optimized through three adjustments. Like FIG. 12, FIG. 13 shows that Δt in steps S15 and S16 is fixed at Δt4. (Δtd1+C1·Δtd1) is represented as Δtd3 and (Δtd2+C2·Δtd2) is represented as Δtd4.

As shown in FIG. 13, the first clock CLK1 initially generated on the basis of the second clock CLK2 falls (time t3) after the rising edge (time t2) of the fifth clock CLK5, and rises (time t4) before the rising edge (time t5) of the sixth clock CLK6. Accordingly, the first phase difference signal UP="L" and the second phase difference signal DN="H" (step S33, NO). That is, in this condition, the period when the first clock CLK1 is at the "H" level is too long. This corresponds to the "initial state" shown in the figure.

Thus, the duty adjuster 3 then reduces the period when the first clock CLK1 is at the "H" level by Δt4. This corresponds to the "state after the first correction". That is, the fall timing of the first clock CLK1 changes from the time t3 to the time t6. However, the rising edge (time t4) of the first clock CLK1 is still earlier than the rise timing (time t7) of the sixth clock CLK6. Accordingly, the first phase difference signal UP="L" and the second phase difference signal DN="H" (step S33, NO). That is, in this condition, the period when the first clock CLK1 is at the "H" level is still too long, Thus, the duty adjuster 3 further reduces the period when the first clock CLK1 is at the "H" level by Δt4. This corresponds to the "state after the second correction". That is, the fail timing of the first clock CLK1 changes from the time t6 to a time t8. However, the rising edge (time t4) of the first clock CLK1 is still earlier than the rising edge (time t7) of the sixth clock CLK6. Accordingly, the first phase difference signal UP="L" and the second phase difference signal DN="H" (step S33, NO). That is, in this condition, the period when the first clock CLK1 is at the "H" level is still too long.

Thus, the duty adjuster 3 further reduces the period when the first clock CLK1 is at the "H" level by Δt4, This corresponds to the "state after the third correction". That is, the fall timing of the first clock CLK1 changes from the time t8 to the time t9. As a result, the rise timing of the first clock CLK1 is the same as the rise timing (time t4) of the sixth clock CLK6. Accordingly, the first phase difference signal UP="L" and the second phase difference signal DN="L" (step S32, YES). Thus, the adjustment of the duty is finished, The duty adjuster 3 subsequently generates the first clock CLK1 that is at the "H" level between the time t1 and the time t9.

As described above, the duty adjusting method according to the present embodiment exerts the effects (1) and (2), described in the first and second embodiments.

In contrast to the method according to the first embodiment, with the method according to the present embodiment, the operational margin on the first critical path 12 is not necessarily the same as that on the second critical path 13. This is because according to the present embodiment, the duty adjustment is finished when the period when the first clock CLK1 is at the "H" level becomes at least Δtd3 or the period when the first clock CLK1 is at the "L" level becomes at least Δtd4.

However, Δtd3 is longer than the delay time Δtd1 on the first critical path 12 by a specified amount, and Δtd4 is longer than the delay time Δtd2 on the second critical path 13 by a specified amount. Thus, to increase the frequency of the first clock CLK1, the period of one cycle of the first clock CLK1 can be reduced at least by the specified amount. This allows the operating speed of LSI to be improved.

Figure 14:
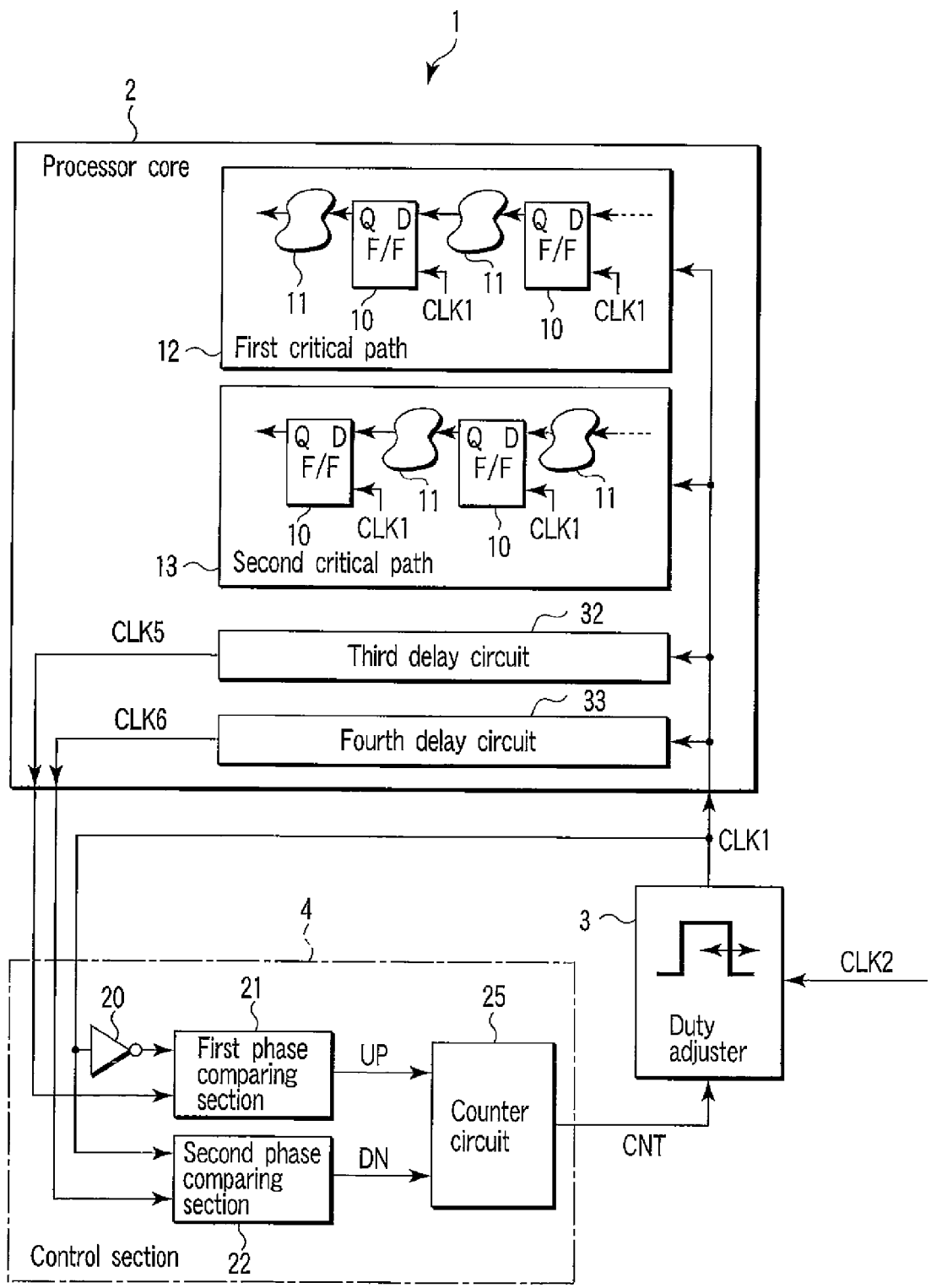
FIG. 14 is a block diagram of LSI according to a variation of the third embodiment of the present invention.

In the description of the present embodiment, the third delay circuit 32 and the fourth delay circuit 33 are provided in the replica circuit 5. However, the replica circuit 5 may be omitted as is the case with the first embodiment. The configuration of LSI 1 in this case is shown in FIG. 14. As shown in the figure, the third delay circuit 32 and the fourth delay circuit 33 are provided in the processor core 2. The fifth clock CLK5 and the sixth clock CLK6 are output by the processor core 2.

Fourth Embodiment

Now, description will be given of a semiconductor integrated circuit device and a duty control method according to a fourth embodiment of the present invention. The present embodiment relates to the configuration of the duty adjuster 3 according to the first to third embodiment. The remaining part of the configuration is similar to that in the first to third embodiments and will thus not be described.

Figure 15:
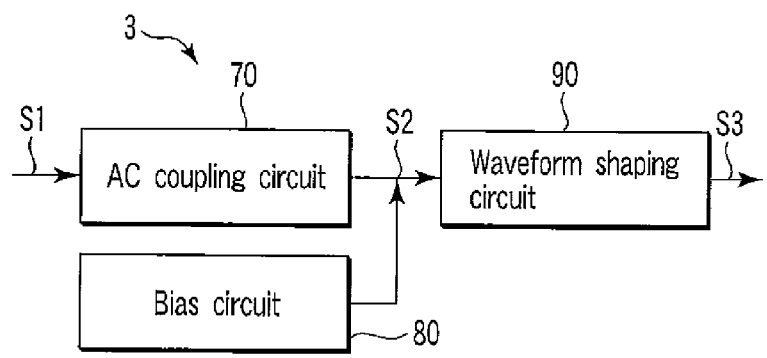
FIG. 15 is a block diagram of a duty adjuster according to a fourth embodiment of the present invention.

FIG. 15 is a block diagram schematically showing the basic configuration of the duty adjuster 3 according to the present embodiment. As shown in FIG. 15, the duty adjuster 3 includes an AC coupling circuit 70, a bias circuit 80, and a waveform shaping circuit 90.

The AC coupling circuit 70 receives a high-speed clock signal, for example, a signal S1 exceeding a GHz order, and extracts an AC component from the signal S1 to output the AC component. The bias circuit 80 generates and outputs a bias voltage to be added to the signal S1 (output signal of the AC coupling circuit 70). The waveform shaping circuit 90 receives a signal S2 and shapes the waveform of the signal S2 to output a signal S3. The signal S2 corresponds to the signal S1 (the AC component) to which the bias voltage output by the bias circuit 80 is added.

That is, the signal S1 corresponds to the second clock CLK2, described in the first to third embodiments. The signal S3 corresponds to the first clock CLK1.

Figure 16:
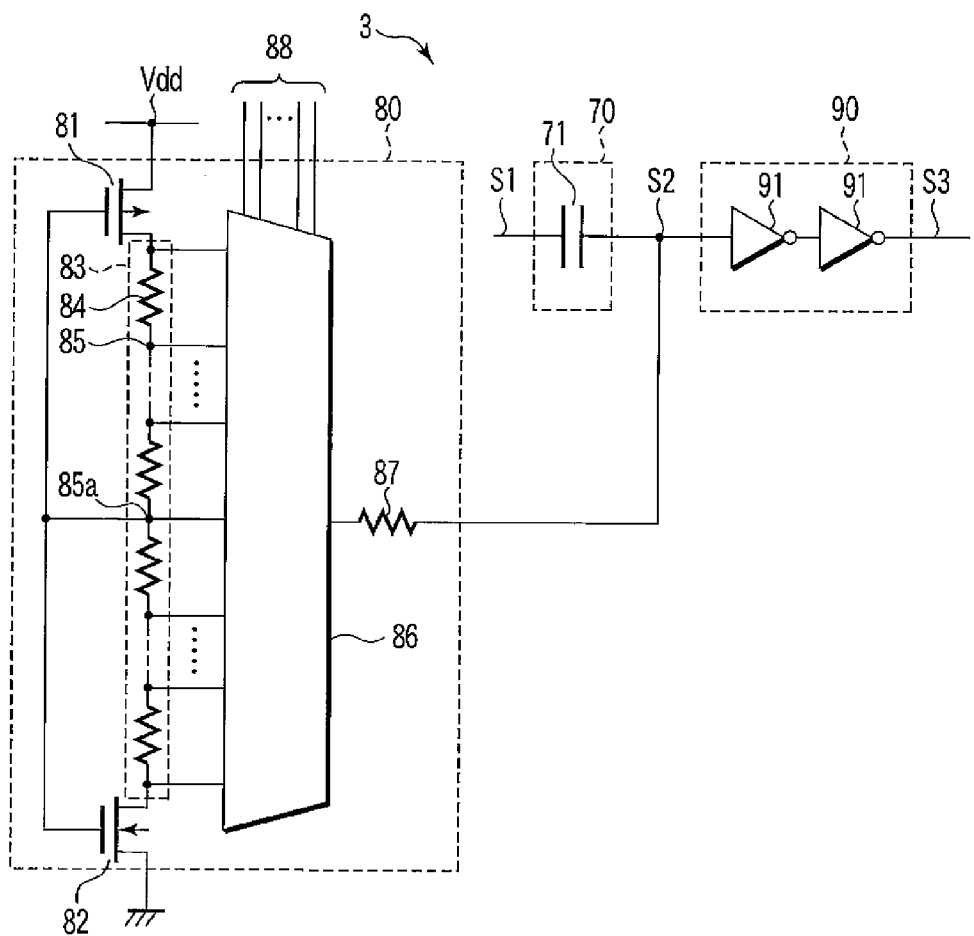
FIG. 16 is a circuit diagram of the duty adjuster according to the fourth embodiment of the present invention.

FIG. 16 is a circuit diagram of the duty adjuster 3 according to the present embodiment. As shown in the figure, the AC coupling circuit 70 has a capacitance 71. One electrode of the capacitance 71 is provided with the signal S1. The other electrode outputs the AC component. That is, the AC coupling circuit 70 removes a DC component from the input signal and outputs the extracted AC component to the waveform shaping circuit 90.

The bias circuit 80 has p-MOSFET (Metal Oxide Semiconductor Field Effect Transistor) 81 (hereinafter referred to as p-MOS) that is a p-channel transistor, n-MOSFET 82 that is an n-channel transistor, a divided resistance electrode 83, and a multiplexer 86.

P-MOS 81 has a source connected to a high-potential power supply voltage Vdd and a drain connected to one end of the divided resistance element. N-MOS 82 has a source connected to a low-potential ground voltage GND and a drain connected to the other end of the divided resistance element 83. A gate of p-MOS 81 and a gate of n-MOS 82 are connected together.

The divided resistance element 83 is connected to between the drain of p-MOS 81 and the drain of n-MOS 82. The divided resistance element 83 includes a plurality of resistance elements connected in series. A central node 85a corresponding to half of all the resistance elements connected in series is connected to the gate of p-MOS 81 and to the gate of n-MOS 82. The plurality of resistance elements 84 have substantially the same value, and for example, 8 to 16 resistance elements are provided. Nodes 85, which is the connection node between the resistance elements 84 in the divided resistance element 83 can output different voltages such that the difference between the voltages of every adjacent pair of nodes 85 is fixed and such that the central node 85a outputs the intermediate voltage.

The multiplexer 86 functions as a switch circuit. An output from each node 85 serving as a connection portion of each of the resistance elements 84 in the divided resistance element 83 is input to the multiplexer 86. The multiplexer 86 selects any of the nodes 85 in accordance with an externally input selector signal 88. The multiplexer 86 then outputs the voltage of the selected node 85 to the waveform shaping circuit 90 via an output resistor 87. The output resistor 87 has a relatively high resistance value (for example, about 50 kΩ). Dividing the divided resistance element 83 into a larger number of the resistance elements 84 enables the bias voltage to be more precisely controlled. The selector signal 88 corresponds to the control signal CNT, described in the first to third embodiments.

The waveform shaping circuit 90 includes a plurality of inverters 91 connected in series. In the description of the present embodiment, the waveform shaping circuit 90 includes two inverters 91. The signal S2 is input to an input node of the preceding inverter 91, which then inverts the signal S2. An input node of the succeeding inverter 91 is connected to an output node of the preceding inverter 91. The succeeding inverter 91 inverts an output signal from the preceding inverter 91 to output the resultant output signal S3.

Figure 17:
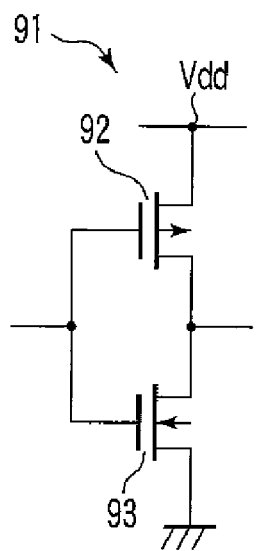
FIG. 17 is a circuit diagram showing a CMOS inverter provided in the duty adjuster according to the fourth embodiment of the present invention.

FIG. 17 is a circuit diagram of the inverter 91. As shown in the figure, the inverter 91 includes, for example, a CMOS (Complementary MOS) structure. That is, the inverter 91 includes p-MOS 92 and n-MOS 93. P-MOS 92 has a source to which the power supply voltage is applied, a drain connected to a drain of n-MOS 93, and a gate connected to a gate of n-MOS 93. N-MOS 93 has a source to which the ground voltage GND is applied. In this configuration, the connection node between the gate of p-MOS 92 and the gate of n-MOS 93 serves as the input node of the inverter 91. The connection node between the drain of p-MOS 92 and the drain of n-MOS 93 serves as the output node of the inverter 91.

The ratio of the channel widths of p-MOS 81 and n-MOS 82 in the bias circuit 80 is substantially the same (in desirable, the same) as that of p-MOS 92 and n-MOS 93 in the inverter circuit 91 in the waveform shaping circuit 90.

In the CMOS structure, the ratio of the channel widths of p-MOS and n-MOS corresponds to a logical threshold voltage of the inverter. The logical threshold voltage is the magnitude of an input signal for which the corresponding output is to be inverted. In semiconductor device manufacturing processes, for example, if a manufacturing variation varies a threshold voltage for p-MOS 92 and n-MOS 93, the logical threshold voltage of the inverter 91 varies. A variation having a similar tendency occurs in the voltage of the central node 85a of the divided resistance element 83, connected to p-MOS 81 and n-MOS 82, having a channel width ratio similar to that of p-MOS 92 and n-MOS 93. That is, if the threshold voltage of p-MOS 92 changes to a relatively greater value to reduce the channel resistance, the logical threshold voltage of the inverter 91 increases. At this time, the threshold voltage of p-MOS 81 in the bias circuit 80 also changes to a relatively greater value to reduce the channel resistance, the voltage of the central node 85a also increases. The logical threshold of the inverter 91 in the waveform shaping circuit 90 is substantially the same as the voltage of the central node 85a.

Figure 18:
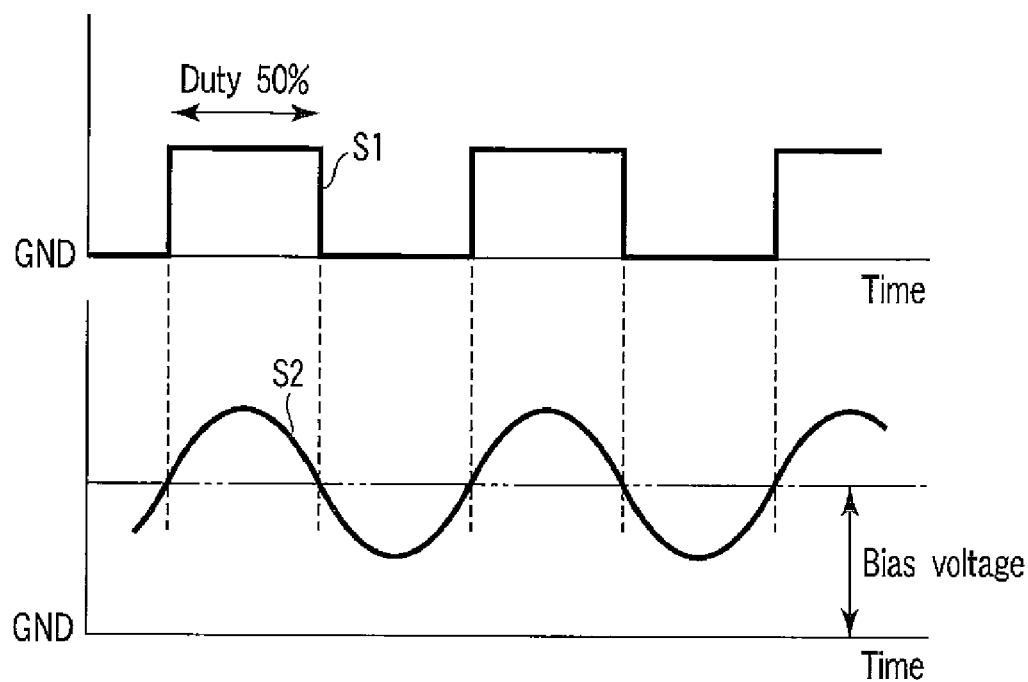
Figure 19:
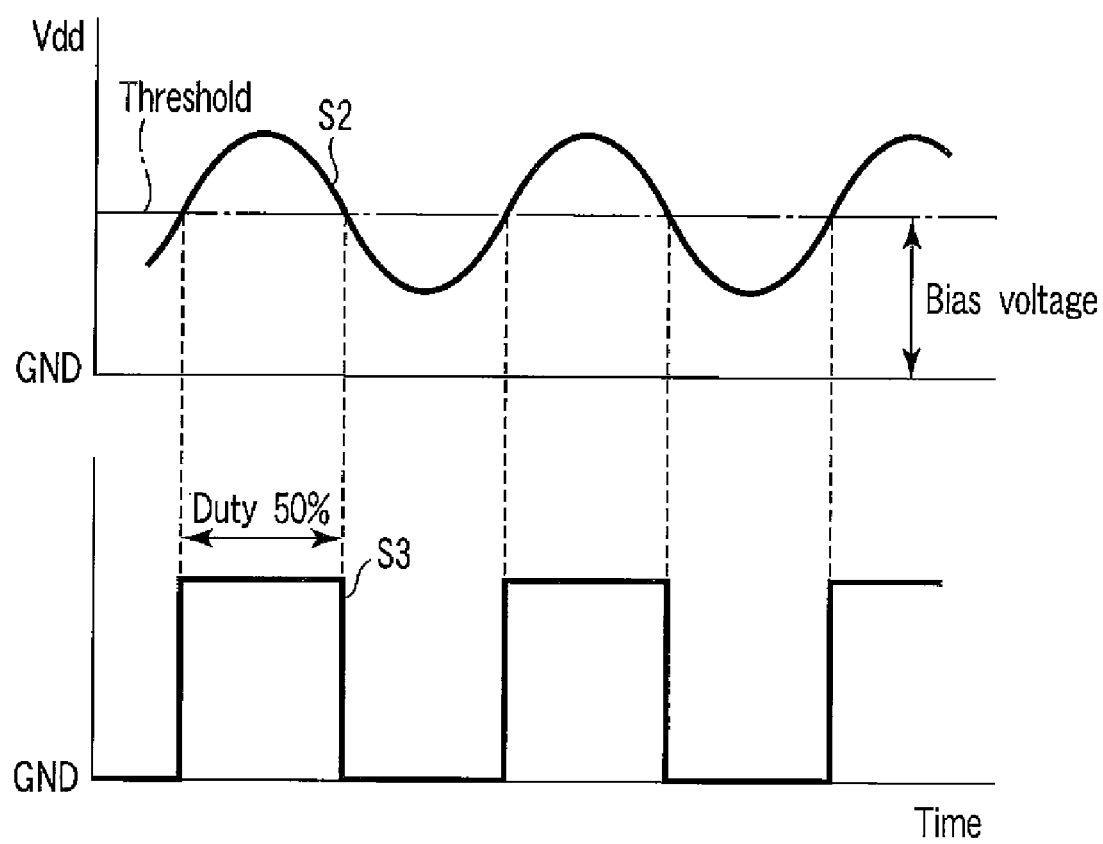

Now, the operation of the duty adjuster 3 according to the present embodiment will be described. FIG. 18 is a waveform diagram showing a waveform from the duty adjuster 3 which has not been input to the waveform shaping circuit yet. An upper stage in FIG. 18 shows the signal S1 (CLK2) and a lower stage shows the signal S2. FIGS. 19 to 21 are schematic waveform diagrams illustrating the operation of the duty adjuster 3. An upper stage in each of FIGS. 19 to 21 shows the signal S2, and a lower stage shows the signal S3 (CLK1). In each of the figures, the axis of abscissa indicates time, and the axis of ordinate indicates voltage.

First, as shown in FIG. 18, the signal S1, a high-speed clock signal having a frequency of a MHz to GHz order, is input to the AC coupling circuit 70. The amplitude of the signal S1 is between the amplitudes of the power supply voltage Vdd and the ground voltage GND. An increase in speed reduces the amplitude of the signal below that of the power supply voltage Vdd. When the period is defined as T and the "H" level period is defined as T(H), the duty D is represented as D(%)=(T(H)/T)×100. For example, the duty of the signal S1 is about 50%. The bias voltage generated and selected by the bias circuit 21 is added to the signal S1 having passed the AC coupling circuit 70, to form the signal S2, which is then sent to the waveform shaping circuit 90.

As shown in FIG. 19, the bias voltage output by the central node 85a in the bias circuit 80 in accordance with the selector signal 88 is added to the waveform of the signal passed thorough the AC coupling circuit 70, thereby the signal S2 is generated. The bias voltage output by the central node 85a is equal to the logical threshold voltage of the inverter 91. As a result, the signal S3 such as the one shown in FIG. 19 is generated by the waveform shaping circuit 90. The logical threshold voltage of the inverter 91 in the waveform shaping circuit 90 matches the bias voltage output by the central node 85a. This results in the signal S3 having the same duty as that of the signal S1, that is, the signal S3 has a duty of about 50%.

Now, with reference to FIG. 20, description will be given of the case in which the signal S3 of duty less than 50% is obtained. In this case, as shown in FIG. 20, the bias voltage output by the node 85 having a lower voltage than the central node 85a in the bias circuit 80 in accordance with the selector signal 88 is added to the waveform of the signal passed thorough the AC coupling circuit 70, thereby the signal S2 is generated. The bias voltage output by the lower-voltage node 85 is lower than the logical threshold voltage of the inverter 91.

The signal S2 passes through the waveform shaping circuit 90 to form the signal S3. Compared to the logical threshold voltage of the inverter 91 in the waveform shaping circuit 90, the signal S2 has a generally lowered distribution. As a result, the distribution of the signal S2 exceeding the logical threshold voltage corresponds to the signal S3 having a waveform with a duty lower than 50%.

Now, with reference to FIG. 20, description will be given of the case in which the signal S3 of duty more than 50% is obtained. In this case, as shown in FIG. 20, the bias voltage output by the node 85 having a higher voltage than the central node 85a in the bias circuit 80 in accordance with the selector signal 88 is added to the waveform of the signal passed thorough the AC coupling circuit 70, thereby the signal S2 is generated. The bias voltage output by the higher-voltage node 85 is higher than the logical threshold voltage of the inverter 91.

The signal S2 passes through the waveform shaping circuit 90 to form the signal S3. Compared to the logical threshold voltage of the inverter 91 in the waveform shaping circuit 90, the signal S2 has a generally raised distribution. As a result, the distribution of the signal S2 exceeding the logical threshold voltage corresponds to the signal S3 having a waveform with a duty higher than 50%.

As described above, the duty adjuster according to the present embodiment newly exerts effects (3) and (4).

(3) The first clock CLK1 having the desired duty is obtained.

As described above, the duty adjuster 3 allows the AC coupling circuit 70 to extract the AC component from the input signal S1 (second clock CLK2). The duty adjuster 3 then adds the bias voltage to the extracted AC component. The bias circuit 80, which generates the bias voltage, has the CMOS structure including the p-MOS 81 and the n-MOS 82. The divided resistance element 83 is further connected to between the drain of p-MOS 81 and the drain of n-MOS 82. The multiplexer 86 appropriately selects the desired one of the nodes in the divided resistance element 83 to output the voltage of the selected node as the bias voltage. The signal S3 with the desired duty (first clock CLK1) is thus obtained.

For example, the input signal S1 of duty 50% passes through the AC coupling circuit 70. The bias voltage from the bias circuit 80 which has been selected in accordance with the selector signal 88 is added to the signal S1. This enables the duty of the signal 33 having passed the waveform shaping circuit 90 to be set at about 50%, at most 50%, or at least 50%. That is, the appropriate selection of the bias voltage enables the signal S3 of the desired duty to be output.

More specifically, the duty of 50% is obtained by making the bias voltage added to the AC component equal to the logical threshold voltage of the inverter 91. To set the duty less than 50%, the bias voltage may be set lower than the logical threshold voltage. To set the duty more than 50%, the bias voltage may be set higher than the logical threshold voltage.

In the present embodiment, the input signal S1 has a duty of 50%. However, the duty of the signal S3 having passed the waveform shaping circuit 90 may be set at about 50% when the duty of the signal S1 is, for example, 40%. In contrast, the duty of the signal S3 having passed the waveform shaping circuit 90 may be set at about 50% when the duty of the signal S1 is, for example, 60%. That is, the duty adjuster 3 can set the duty of the input signal S1 at about 50% and output the resultant signal S3.

The duty adjuster 3 can provide the multiplexer 86 with the selector signal 88 to select the bias voltage. The duty adjuster 3 can thus set the duty of the input signal S1 at the desired value to output the resultant signal S3. Furthermore, if the duty of the input signal S1 changes, the signal S3 with a duty closer to the desired one can be output by changing the bias voltage in accordance with the selector signal 88.

(4) The accuracy with which the duty is adjusted can be improved.

The duty adjuster 3 according to the present embodiment sets the ratio of the channel widths of p-MOS 81 and n-MOS 82 in the bias circuit 80 substantially the same (in desirable, the same) as that of p-MOS 63 and n-MOS 65 in the inverter 91 in the waveform shaping circuit 90. Consequently, even if a manufacturing variation occurs during the semiconductor device manufacturing process to vary the threshold voltage for p-MOS 92 and n-MOS 93 and thus the logical threshold voltage of the inverter 91, the voltage of the central node 85a in the divided resistance element 83, connected to p-MOS 81 and n-MOS 82 in the bias circuit 80, also varies so as to exhibit a similar tendency. This enables a reduction in the adverse effect of the manufacturing variation on the duty of the output signal S3.

More specifically, it is assumed that a manufacturing variation has increased the threshold voltage of the inverter 91 above a predetermined design value. However, a similar manufacturing variation occurs in the bias circuit 80. Thus, the voltage extracted from the node 85 increases above a predetermined design value owing to the manufacturing variation. The degree of the increase is similar to that in the inverter 91. That is, the adverse effect of the increase in the threshold voltage of the inverter 91 is offset by the increase in the voltage of the node 85. Therefore, the accuracy of the duty adjustment can be improved.

Fifth Embodiment

Now, description will be given of a semiconductor integrated circuit device and a duty control method according to a fifth embodiment of the present invention. The present embodiment corresponds to the fourth embodiment in which the bias circuit 80 in the duty adjuster 3 has a varied configuration. The remaining part of the configuration is similar to that in the first to third embodiments and will thus not be described.

Figure 22:
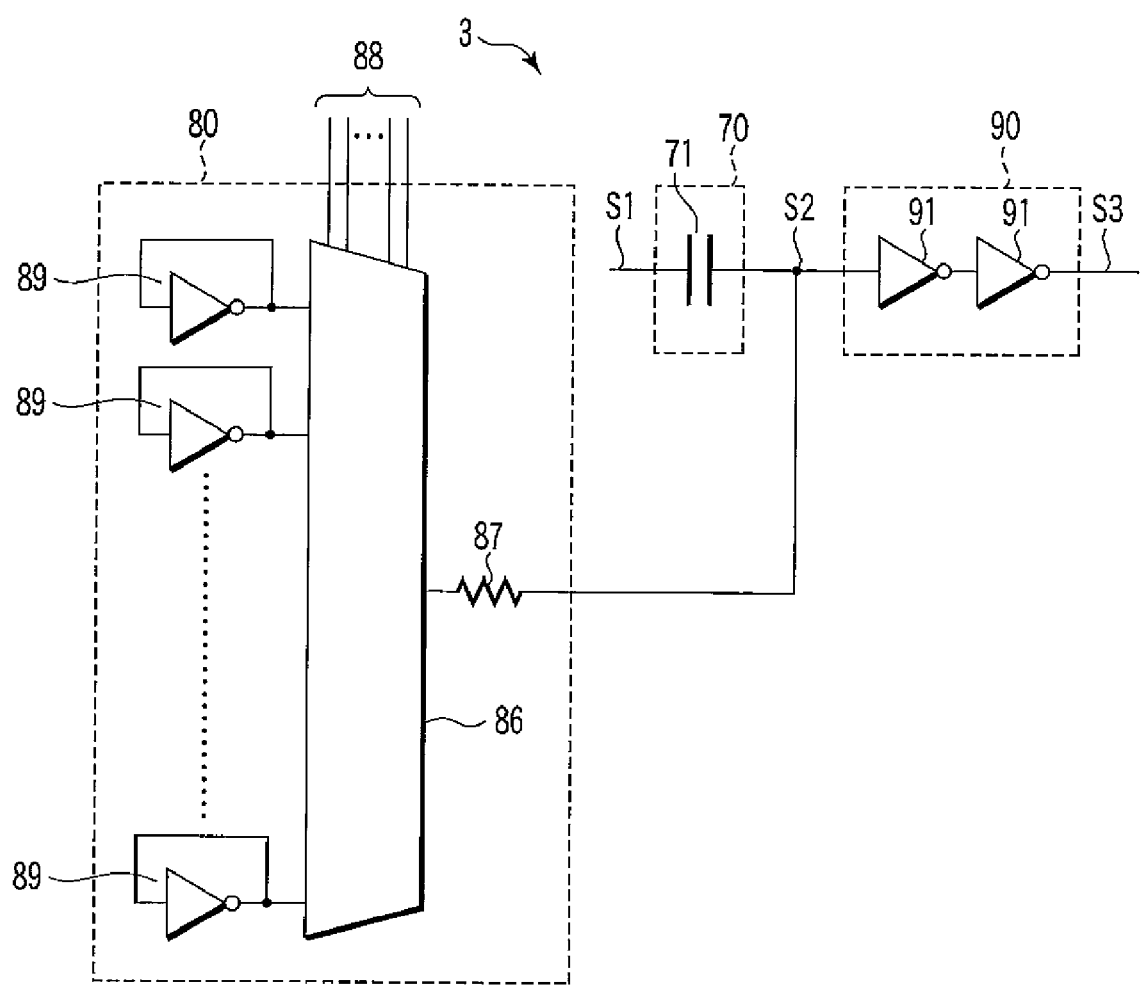
FIG. 22 is a circuit diagram of a duty adjuster according to a fifth embodiment of the present invention.

FIG. 22 is a circuit diagram of the duty adjuster 3 according to the present embodiment. Only differences from FIG. 16, described in the fourth embodiment, will be described. As shown in the figure, the bias circuit 80 in the duty adjuster 3 according to the present embodiment has the configuration described in FIG. 16 but from which p-MOS 81, n-MOS 82, and the divided resistance element 83 are omitted and in which a plurality of inverters 89 are newly provided. Each of the inverters 89 has the CMOS configuration and has the circuit configuration described in FIG. 17. Each of the inverters 89 has an input node and an output node connected together. The multiplexer 86 selects any of the outputs from the inverters 89. The remaining part of the configuration is similar to that in the fourth embodiment.

Each of the inverters 89 has the input node and the output node connected together and thus outputs a logical threshold voltage corresponding to the ratio of the channel widths of p-MOS and n-MOS. In the present embodiment, the ratio of the channel widths is set so that an output voltage from each inverter 89 is similar to the voltage of each of the nodes 85, described with reference to FIG. 16.

Figure 23:
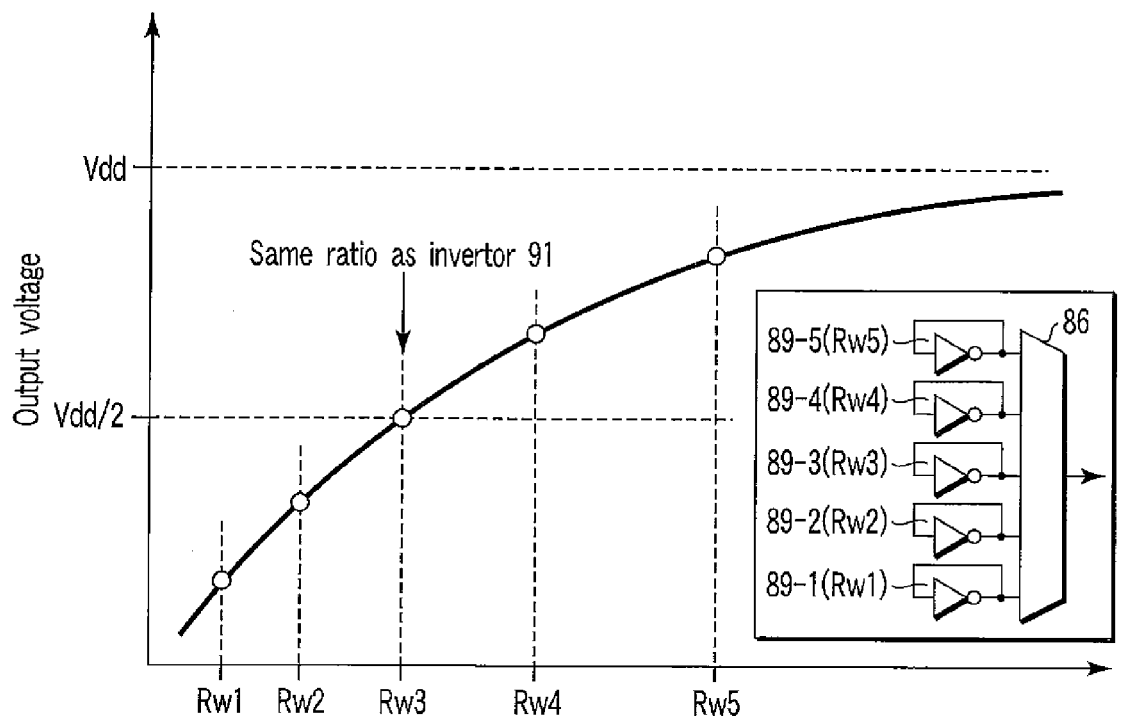
FIG. 23 is a graph showing the relationship between channel width ratio and output voltage in the duty adjuster according to the fifth embodiment of the present invention.

The relationship between the channel width and output voltage of each inverter 89 will be described with reference to FIG. 23. FIG. 23 is a graph showing the relationship between the channel width and output voltage of the inverter 89. For simplification of description, FIG. 23 shows the five inverters 89 that are called the inverters 89-1 to 89-5. For each of the inverters 89, the ratio of the channel width Wn of n-MOS to the channel width Wp of p-MOS is denoted by Rw. The ratio Rw for the inverter 89-$i$ ($i$ is one of 1 to 5) is denoted by Rwi. Channel length L is fixed. The channel length is the width of the channel in a direction in which the drain, the channel, and the source are arranged. The channel width is the width of the channel in a direction orthogonal to the channel length. The channel width and channel length described below may be replaced with a gate width and gate length, respectively.

As shown in FIG. 23, a ratio Rw3 for the inverter 89-3 is set equal to the ratio Rw for the inverter 91. Accordingly, an output voltage from the inverter 89-3 is Vdd/2. Thus, if the multiplexer 86 selects the output from the inverter 89-3, the duty of the signal S3 is 50%.

A ratio Rw2 for the inverter 89-2 is set lower than the ratio Rw3, and a ratio Rw1 for the inverter 89-1 is set lower than the ratio Rw2. Accordingly, output voltages from the inverters 89-2 and 89-1 are lower than Vdd/2. If the multiplexer 86 selects the output from the inverter 89-2, the duty of the signal S3 is less than 50%. If the multiplexer 86 selects the output from the inverter 89-1, the duty of the signal S3 further decreases.

A ratio Rw4 for the inverter 89-4 is set higher than the ratio Rw3, and a ratio Rw5 for the inverter 89-5 is set higher than the ratio Rw4. Accordingly, output voltages from the inverters 89-4 and 89-5 are lower than Vdd/2. If the multiplexer 86 selects the output from the inverter 89-4, the duty of the signal S3 is more than 50%. If the multiplexer 86 selects the output from the inverter 89-5, the duty of the signal S3 further increases.

As described above, the duty adjuster according to the present embodiment newly exerts an effect (5).

(5) The circuit area of the duty adjuster 3 can be reduced.

The configuration according to the present embodiment uses the inverter 89 to generate the bias voltage. The inverter 89 can be normally formed smaller than the resistance element 84. The configuration according to the present embodiment thus enables a reduction in the area occupied by the bias circuit 80 and in the circuit area of the duty adjuster 3 compared to the configuration in FIG. 16.

In the description of the present embodiment, the channel length of the inverters 89-1 to 89-5 is equal to that of the inverter 91 as shown in FIG. 23. In this case, the output voltage can be increased by increasing the ratio of the channel widths of the inverters 89-1 to 89-5. However, the channel length need not be equal to that of the inverter 91, and not all the inverters need be the same. That is, the ratio Rw may be considered to be ((Wp/Lp)/(Wn/Ln)). It is only necessary that the ratio Rw for the inverter 89-3 be equal to the ratio for the inverter 91 in the inverter 89-3 and that the relationship Rw1<Rw2<Rw3<Rw4<Rw5 be met.

As described above, the semiconductor integrated circuit device and the duty control method according to the first to fifth embodiments of the present invention use information provided by the critical paths in the processor core to optimize the duty of the clock required to operate the processor core.

More specifically, the semiconductor integrated circuit device and the duty control method according to the first to fifth embodiments of the present invention use the delay time Δtd1 on the first critical path 12, which is active while the clock is at the "H" level, and the delay time Δtd2 on the first critical path 13, which is active while the clock is at the "L" level. The first and second embodiments adjust the duty so that the operational margin (Δt_H−Δtd1) for the first critical path 12 is equal to the operational margin ("L" level period−Δtd2) for the second critical path 13. The third embodiment adjusts the duty so as to meet the operational margin (C1·Δtd1) provided for the first critical path 12 or the operational margin (C1·Δtd2) provided for the second critical path 13. This enables an increase in the frequency of the clock and in the speed of the operation of the processor core.

Furthermore, the above-described control is performed by the control section 4. The duty of the clock can thus be dynamically adjusted. That is, the duty can be appropriately adjusted even after the manufacture of LSI 1. As a result, even if a variation occurs in the process of manufacturing LSI 1, degradation of the duty caused by the variation can be corrected by the control section 4. If the duty cannot be dynamically adjusted as in the conventional art, a process variation may prevent the duty from being optimized. To optimally correct all chips, the results of evaluation of the critical paths on each chip must be fed back to chip design. This requires a very long test time. This tendency is particularly significant if the device includes both circuits that are active while the clock is at the "H" level and circuits that are active while the clock is at the "L" level. However, the configuration according to the present embodiment allows the duty to be optimized even after the manufacture of chips. This enables an increase in the yield of chips and a reduction in test time and thus in manufacturing costs. Furthermore, the duty can be adjusted even during the operation of LSI and thus optimized in response to a variation in operating conditions such as ambient temperature and operating voltage. As a result, the performance of LSI 1 can be optimized regardless of the operating conditions.

In particular, the above-described embodiments exerts significant effects when being applied to, for example, a semiconductor memory using a DDR (Double Data Rate) mode or a microprocessor designed to set timings using a clock with a very high frequency.

In the first and second embodiments, the first and second phase comparing sections 21 and 22 compare the rise timings of the first clocks /CLK1 and CLK1 with the rise timings of the third and fourth clocks CLK3 and CLK4, respectively. In the third embodiment, the first and second phase comparing sections 21 and 22 compare the rise timings of the first clocks /CLK1 and CLK1 with the rise timings of the fifth and sixth clocks CLK5 and CLK6, respectively. However, the first and second phase comparing sections 21 and 22 may each compare the rise timing of one clock with the fall timing of another clock or the fall timings of two clocks with each other. That is, the third to sixth clocks CLK3 to CLK6 have only to be delayed with respect to the first clock CLK1 by $\Delta td1$ to $\Delta td4$, respectively. In other words, the third and fourth clocks CLK3 and CLK4 have only to indicate how long the clocks CLK3 and CLK4 are delayed on the first and second critical paths 12 and 13, respectively. The fifth and sixth clocks CLK5 and CLK6 have only to indicate the lengths of time obtained by adding the respective operational margins to the delays on the first and second critical paths 12 and 13. Of course, the duty adjuster 3 is not limited to the adjustment of the fall timing of the clock but may adjust the rise timing or both the rise and fall timings.

Figure 24:
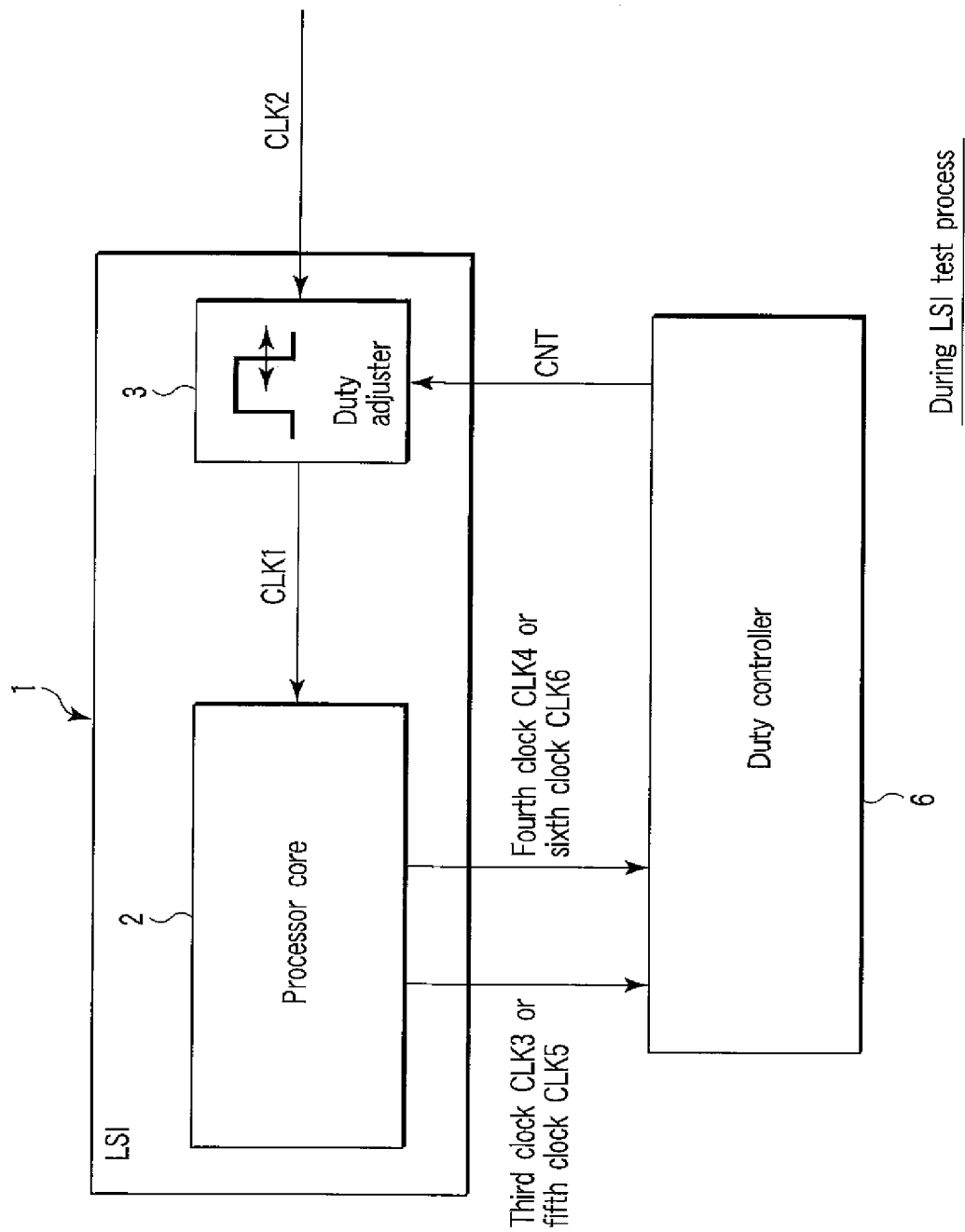
FIG. 24 is a block diagram of LSI according to a variation of the first to third embodiments.

Furthermore, the duty adjustment described above in the embodiments need not necessarily be performed inside LSI 1. That is, the control section 4 need not be located inside LSI 1. Such a configuration is shown in FIG. 24. FIG. 24 is a block diagram showing a test process executed on LSI 1 before shipment. As shown in the figure, LSI 1 is controlled to a duty controller 6 for the test process. The duty controller 6 has the configuration of the control section 4, described in the first to third embodiments. The duty controller uses the third clock CLK3 and fourth clock CLK4 or the fifth clock CLK5 and sixth clock CLK6, output by LSI 1 to generate the control signal CNT to control the duty of LSI 1.

Furthermore, in the third embodiment, the fifth clock CLK5 rises $\Delta td3$ later than the rising edge of the first clock CLK1. The sixth clock CLK6 rises $\Delta td4$ later than the falling edge of the first clock CLK1. $\Delta td3$ is obtained by adding $C1 \cdot \Delta td1$ to the delay time td1 on the first critical path 12. $\Delta td4$ is obtained by adding $C2 \cdot \Delta td2$ to the delay time td2 on the second critical path 13. The values of C1 and C2 can be appropriately selected and may be the same or different. The time delays $\Delta td1$ and $\Delta td2$, occurring on the first and second critical paths 12 and 13, respectively, are not fixed but vary dynamically depending on operating environments such as voltage and temperature. Thus, duty corrections performed using $\Delta td1$ and $\Delta td2$ under certain conditions (voltage and temperature) may not be sufficient under continuously varying conditions. Sufficient duty corrections can be achieved by adding $C1 \cdot \Delta td1$ and $C2 \cdot \Delta td2$ to the delay times $\Delta td1$ and $\Delta td2$, respectively, which vary dynamically depending on the operating environments.

Moreover, the duty adjuster 3 can achieve duty adjustments using the high-speed clock signal exceeding the GHz order. However, of course, the duty adjuster 3 can adjust the duty of a signal of an MHz order in addition to the duty of the signal of the GHz order. Furthermore, preferably, the resistance elements 84 in FIG. 16 are substantially the same or the same resistance values, and the number of resistance elements 84 is even.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:

a processor core operating in synchronism with a first clock and including a first critical path which is active while the first clock is at an "H" level and a second critical path which is active while the first clock is at an "L" level;

a first clock generating section controlling a duty of an externally input second clock to generate the first clock; and a control section detecting a first phase difference between the first clock and a third clock obtained by delaying the first clock by a delay time occurring on the first critical path and a second phase difference between the first clock and a fourth clock obtained by delaying the first clock by a delay time occurring on the second critical path, the control section instructing the first clock generating section to control the duty so as to minimize a difference between the first phase difference and the second phase difference.

2. The device according to claim 1, wherein the control section includes a first phase difference detecting section generating a first pulse corresponding to a period from a rise timing of the third clock to a rise timing of an inversion signal of the first clock;

a second phase difference detecting section generating a second pulse corresponding to a period from a rise timing of the fourth clock to a rise timing of the first clock; and a conversion section converting a difference between a pulse width of the first pulse and a pulse width of the second pulse, and the control section controls the duty in accordance with the voltage obtained by the conversion section.

3. The device according to claim 1, further comprising a replica circuit for the first and second critical paths, wherein the control section uses the third and fourth clocks generated by the replica circuit to detect the first and second phase differences.

4. The device according to claim 1, wherein the first clock generating section includes an AC coupling circuit allowing an AC component of the second clock to pass through;

a bias circuit including a voltage setting circuit having a plurality of voltage output nodes configured to generate different voltages and a switch circuit selecting one of the voltage output nodes to output a voltage of the selected voltage output node, to add the voltage of the selected voltage output node to the AC component; and a waveform shaping circuit shaping the AC component to which the voltage has been added to generate the first clock.

5. The device according to claim 1, wherein the voltage setting circuit includes a p-channel first transistor having a source connected to a high potential power supply;

an n-channel second transistor having a source connected to a low potential power supply and a gate connected to a gate of the first transistor; and a plurality of resistance elements connected in series between a drain of the first transistor and a drain of the second transistor, wherein connection nodes between the resistance elements serve as the voltage output nodes, one of the voltage output nodes outputs a median for a voltage drop occurring between the drain of the second transistor and the drain of the first transistor, and the voltage output node outputting the median is connected to the gates of the first transistor and the second transistor.

6. The device according to claim 5, wherein the resistance elements have the same resistance value, and the number of the resistance elements is even.

7. The device according to claim 5, wherein the waveform shaping circuit includes
a p-channel third transistor having a source connected to the high potential power supply; and
an n-channel fourth transistor having a source connected to the low potential power supply, a drain connected to a drain of the third transistor, and a gate connected to a gate of the third transistor,
wherein the AC component to which the voltage has been added is input to the gates of the third and fourth transistors, and
a ratio of channel widths of the first and second transistors is equal to a ratio of channel widths of the third and fourth transistors.

8. The device according to claim 4, wherein the voltage setting circuit includes
a plurality of inverters each including a p-channel first transistor and an n-channel second transistor and having an input node and an output node connected together,
the output node of each of the inverters serves as one of the voltage output nodes, and
the first transistor has a source connected to a high potential power supply, a drain connected to a drain of the second transistor, and a gate connected to a gate of the second transistor, and
the second transistor has a source connected to the low potential power supply.

9. The device according to claim 8, wherein the waveform shaping circuit includes
a p-channel third transistor having a source connected to the high potential power supply; and
an n-channel fourth transistor having a source connected to the low potential power supply, a drain connected to a drain of the third transistor, and a gate connected to a gate of the third transistor,
wherein the AC component to which the voltage has been added is input to the gates of the third and fourth transistors,
a ratio of the channel widths of the first and second transistors in one of the inverters is equal to a ratio of the channel widths of the third and fourth transistors, and
the ratio of the channel widths of the first and second transistors in each of the other inverters is different from the ratio of the channel widths of the third and fourth transistors.

10. A semiconductor integrated circuit device comprising:
a processor core operating in synchronism with a first clock and including a first critical path which is active while the first clock is at an "H" level and a second critical path which is active while the first clock is at an "L" level;
a first clock generating section controlling a duty of an externally input second clock to generate the first clock;
a third clock generating section generating a third clock indicating a timing delayed from a rising edge of the first clock by a delay time longer than a delay time occurring on the first critical path;
a fourth clock generating section generating a fourth clock indicating a timing delayed from a falling edge of the first clock by a delay time longer than a delay time occurring on the second critical path; and
a control section detecting a first phase difference between the first clock and the third clock and a second phase difference between the first clock and the fourth clock and instructing the first clock generating section to control the duty so as to minimize one of the first phase difference and the second phase difference.

11. The device according to claim 10, wherein the control section includes
a first phase difference detecting section generating a first pulse if a fall timing of the first clock is earlier than a rise timing of the third clock;
a second phase difference detecting section generating a second pulse if a rise timing of the first clock is earlier than a rise timing of the fourth clock; and
a counter counting the first pulse and the second pulse,
wherein the counter increases the duty after having counted the first pulse and reduces the duty after having counted the second pulse.

12. The device according to claim 10, further comprising a replica circuit for the first and second critical paths,
wherein the control section uses the third and fourth clocks generated by the replica circuit to detect the first and second phase differences.

13. The device according to claim 10, wherein the first clock generating section includes
an AC coupling circuit allowing an AC component of the second clock to pass through;
a bias circuit including a voltage setting circuit having a plurality of voltage output nodes configured to generate different voltages and a switch circuit selecting one of the voltage output nodes to output a voltage of the selected voltage output node, to add the voltage of the selected voltage output node to the AC component; and
a waveform shaping circuit shaping the AC component to which the voltage has been added to generate the first clock.

14. The device according to claim 13, wherein the voltage setting circuit includes
a p-channel first transistor having a source connected to a high potential power supply;
an n-channel second transistor having a source connected to a low potential power supply and a gate connected to a gate of the first transistor; and
a plurality of resistance elements connected in series between a drain of the first transistor and a drain of the second transistor,
wherein connection nodes between the resistance elements serve as the voltage output nodes,
one of the voltage output nodes outputs a median for a voltage drop occurring between the drain of the second transistor and the drain of the first transistor, and
the voltage output node outputting the median is connected to the gates of the first transistor and the second transistor.

15. The device according to claim 14, wherein the resistance elements have the same resistance value, and the number of the resistance elements is even.

16. The device according to claim 14, wherein the waveform shaping circuit includes
a p-channel third transistor having a source connected to the high potential power supply; and
an n-channel fourth transistor having a source connected to the low potential power supply, a drain connected to a drain of the third transistor, and a
gate connected to a gate of the third transistor, wherein the AC component to which the voltage has been added is input to the gates of the third and fourth transistors, and a ratio of channel widths of the first and second transistors is equal to a ratio of channel widths of the third and fourth transistors.

17. The device according to claim 13, wherein the voltage setting circuit includes a plurality of inverters each including a p-channel first transistor and an n-channel second transistor and having an input node and an output node connected together, the output node of each of the inverters serves as one of the voltage output nodes, and the first transistor has a source connected to a high potential power supply, a drain connected to a drain of the second transistor, and a gate connected to a gate of the second transistor, and the second transistor has a source connected to the low potential power supply.

18. The device according to claim 17, wherein the waveform shaping circuit includes a p-channel third transistor having a source connected to the high potential power supply; and an n-channel fourth transistor having a source connected to the low potential power supply, a drain connected to a drain of the third transistor, and a gate connected to a gate of the third transistor, wherein the AC component to which the voltage has been added is input to the gates of the third and fourth transistors, a ratio of the channel widths of the first and second transistors in one of the inverters is equal to a ratio of the channel widths of the third and fourth transistors, and the ratio of the channel widths of the first and second transistors in each of the other inverters is different from the ratio of the channel widths of the third and fourth transistors.

19. A method for controlling a duty of a first clock operating a processor core, the method comprising:

generating a first clock on the basis of an externally input second clock;

allowing the processor core to generate a third clock by delaying the first clock by a delay time occurring on a first critical path which is active while the first clock is at an "H" level;

allowing the processor core to generate a fourth clock by delaying the first clock by a delay time occurring on a second critical path which is active while the first clock is at an "L" level;

detecting a first phase difference between the first clock and the third clock;

detecting a second phase difference between the first clock and the fourth clock; and controlling a duty of the first clock so as to minimize a difference between the first phase difference and the second phase difference.

20. The method according to claim 19, wherein the third clock and the fourth clock are generated by a replica circuit for the processor core.

\* \* \* \* \*